United States Patent
Lewis et al.

(10) Patent No.: US 8,405,649 B2
(45) Date of Patent: Mar. 26, 2013

(54) LOW VOLTAGE DRIVER SCHEME FOR INTERFEROMETRIC MODULATORS

(75) Inventors: Alan G. Lewis, Sunnyvale, CA (US); Marc M. Mignard, San Jose, CA (US); Clarence Chui, San Jose, CA (US); Wilhelmus Johannes Robertus Van Lier, San Diego, CA (US); Mark M. Todorovich, San Diego, CA (US); William Cummings, Millbrae, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 927 days.

(21) Appl. No.: 12/413,336

(22) Filed: Mar. 27, 2009

(65) Prior Publication Data

US 2010/0245313 A1 Sep. 30, 2010

(51) Int. Cl.
*G06F 3/038* (2006.01)

(52) U.S. Cl. ....................................... 345/212

(58) Field of Classification Search ................. None
See application file for complete search history.

(56) References Cited

U.S. PATENT DOCUMENTS

| | | |
|---|---|---|
| 4,709,995 A | 12/1987 | Kuribayashi et al. |
| 4,954,789 A | 9/1990 | Sampsell |
| 5,055,833 A | 10/1991 | Hehlen et al. |
| 5,227,900 A | 7/1993 | Inaba et al. |
| 5,285,196 A | 2/1994 | Gale |
| 5,699,075 A | 12/1997 | Miyamoto |
| 5,754,160 A | 5/1998 | Shimizu et al. |
| 5,771,116 A | 6/1998 | Miller et al. |
| 5,784,189 A | 7/1998 | Bozler et al. |
| 5,828,367 A | 10/1998 | Kuga |
| 5,912,758 A | 6/1999 | Knipe et al. |
| 6,040,937 A | 3/2000 | Miles |
| 6,232,942 B1 | 5/2001 | Imoto et al. |
| 6,327,071 B1 | 12/2001 | Kimura |
| 6,356,254 B1 | 3/2002 | Kimura |
| 6,507,330 B1 | 1/2003 | Handschy et al. |
| 6,507,331 B1 | 1/2003 | Schlangen et al. |
| 6,543,286 B2 | 4/2003 | Garverick et al. |

(Continued)

FOREIGN PATENT DOCUMENTS

| | | |
|---|---|---|
| EP | 0 295 802 | 12/1988 |
| EP | 0 300 754 | 1/1989 |

(Continued)

OTHER PUBLICATIONS

ISR and WO in PCT/US10/028552, dated Jan. 20, 2011.

(Continued)

*Primary Examiner* — Joseph Haley
*Assistant Examiner* — Ifedayo Iluyomade
(74) *Attorney, Agent, or Firm* — Knobbe, Martens, Olson & Bear LLP

(57) ABSTRACT

A method of driving electromechanical devices such as interferometric modulators includes applying a voltage along a common line to release the electromechanical devices along the common line, followed by applying an address voltage along the common line to actuate selected electromechanical devices along the common line based on voltages applied along segment lines. Hold voltages may be applied along common lines between applications of release and address voltages, and the segment voltages may be selected to be sufficiently small that the segment voltages will not affect the state of the electromechanical devices along other common lines not being written to.

38 Claims, 14 Drawing Sheets

U.S. PATENT DOCUMENTS

| | | |
|---|---|---|
| 6,574,033 B1 | 6/2003 | Chui et al. |
| 6,636,187 B2 | 10/2003 | Tajima et al. |
| 6,674,562 B1 | 1/2004 | Miles et al. |
| 6,680,792 B2 | 1/2004 | Miles |
| 6,762,873 B1 | 7/2004 | Coker et al. |
| 7,034,783 B2 | 4/2006 | Gates et al. |
| 7,110,158 B2 | 9/2006 | Miles |
| 7,123,216 B1 | 10/2006 | Miles |
| 7,161,728 B2 | 1/2007 | Sampsell et al. |
| 7,327,510 B2 | 2/2008 | Cummings et al. |
| 7,400,489 B2 | 7/2008 | Van Brocklin et al. |
| 7,499,208 B2 | 3/2009 | Mignard |
| 7,515,147 B2 | 4/2009 | Mignard |
| 7,532,385 B2 | 5/2009 | Lin et al. |
| 2001/0026250 A1 | 10/2001 | Inoue et al. |
| 2001/0034075 A1 | 10/2001 | Onoya |
| 2001/0040536 A1 | 11/2001 | Tajima et al. |
| 2001/0052887 A1 | 12/2001 | Tsutsui et al. |
| 2002/0012159 A1 | 1/2002 | Tew |
| 2002/0075555 A1 | 6/2002 | Miles |
| 2002/0093722 A1 | 7/2002 | Chan et al. |
| 2003/0020699 A1 | 1/2003 | Nakatani et al. |
| 2003/0122773 A1 | 7/2003 | Washio et al. |
| 2003/0137215 A1 | 7/2003 | Cabuz |
| 2003/0137521 A1 | 7/2003 | Zehner et al. |
| 2004/0021658 A1 | 2/2004 | Chen |
| 2004/0080382 A1 | 4/2004 | Nakanishi et al. |
| 2004/0136596 A1 | 7/2004 | Oneda et al. |
| 2004/0145553 A1 | 7/2004 | Sala et al. |
| 2005/0001545 A1 | 1/2005 | Aitken et al. |
| 2005/0024301 A1 | 2/2005 | Funston |
| 2006/0057754 A1 | 3/2006 | Cummings |
| 2006/0066559 A1 | 3/2006 | Chui et al. |
| 2006/0066560 A1 | 3/2006 | Gally et al. |
| 2006/0066561 A1 | 3/2006 | Chui et al. |
| 2006/0066594 A1 | 3/2006 | Tyger |
| 2006/0066597 A1 | 3/2006 | Sampsell |
| 2006/0077505 A1 | 4/2006 | Chui et al. |
| 2006/0077520 A1* | 4/2006 | Chui et al. ............ 359/290 |
| 2006/0103643 A1* | 5/2006 | Mathew et al. ........ 345/212 |
| 2006/0250335 A1 | 11/2006 | Stewart et al. |
| 2006/0250350 A1* | 11/2006 | Kothari et al. ......... 345/108 |
| 2007/0075942 A1 | 4/2007 | Martin et al. |
| 2007/0126673 A1 | 6/2007 | Djordjev et al. |
| 2007/0147688 A1 | 6/2007 | Mathew |
| 2007/0182707 A1 | 8/2007 | Kothari |
| 2007/0242008 A1 | 10/2007 | Cummings |
| 2007/0247419 A1 | 10/2007 | Sampsell et al. |
| 2008/0180576 A1 | 7/2008 | Anderson |
| 2009/0219309 A1 | 9/2009 | Sampsell |
| 2009/0219600 A1 | 9/2009 | Gally et al. |
| 2009/0225069 A1 | 9/2009 | Sampsell |
| 2009/0273596 A1 | 11/2009 | Cummings |
| 2010/0026680 A1 | 2/2010 | Chui et al. |
| 2010/0315398 A1 | 12/2010 | Chui et al. |

FOREIGN PATENT DOCUMENTS

| | | |
|---|---|---|
| EP | 0 911 794 | 4/1999 |
| EP | 1 134 721 | 9/2001 |
| EP | 1 239 448 | 9/2002 |
| EP | 1 280 129 | 1/2003 |
| EP | 1 414 011 | 4/2004 |
| EP | 1 640 316 | 3/2006 |
| EP | 1 640 765 | 3/2006 |
| EP | 1 640 953 | 3/2006 |
| JP | 63-055590 | 3/1988 |
| JP | 2000-075963 | 4/2000 |
| JP | 2002-072974 | 3/2002 |
| TW | 546672 | 8/2003 |
| TW | 552720 | 9/2003 |
| WO | WO 94/28452 | 12/1994 |
| WO | WO 02/089103 | 11/2002 |
| WO | WO 03/079323 | 9/2003 |
| WO | WO 2004/054088 | 6/2004 |
| WO | WO 2006/121608 | 11/2006 |

OTHER PUBLICATIONS

Chen et al., Low peak current driving scheme for passive matrix-OLED, SID International Symposium Digest of Technical Papers, May 2003, pp. 504-507.

Miles, MEMS-based interferometric modulator for display applications, Part of the SPIE Conference on Micromachined Devices and Components, vol. 3876, pp. 20-28 (1999).

Miles et al., 5.3: Digital Paper™: Reflective displays using interferometric modulation, SID Digest, vol. XXXI, 2000 pp. 32-35.

Invitation to Pay Additional Fees in PCT/US10/028552, dated Jun. 18, 2010.

Miles, MEMS-based interferometric modulator for display applications, Proceedings of the SPIE, Micromachined Devices and Components V, Sep. 1999, pp. 20-28.

IPRP dated Aug. 1, 2011 in PCT/US0/028552.

* cited by examiner

|  | $VC_{ADD\_H}$ | $VC_{HOLD\_H}$ | $VC_{REL}$ | $VC_{HOLD\_L}$ | $VC_{ADD\_L}$ |
|---|---|---|---|---|---|
| $VS_H$ | Stable | Stable | Release | Stable | Actuate |
| $VS_L$ | Actuate | Stable | Release | Stable | Stable |

Segment Voltages / Common Voltages

FIGURE 10

LOW VOLTAGE DRIVER SCHEME FOR INTERFEROMETRIC MODULATORS

BACKGROUND OF THE INVENTION

1. Field of the Invention

This invention is related to methods and devices for driving electromechanical devices such as interferometric modulators.

2. Description of the Related Art

Electromechanical systems include devices having electrical and mechanical elements, actuators, transducers, sensors, optical components (e.g., mirrors), and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers or that add layers to form electrical and electromechanical devices. In the following description, the term MEMS device is used as a general term to refer to electromechanical devices, and is not intended to refer to any particular scale of electromechanical devices unless specifically noted otherwise.

One type of electromechanical systems device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one aspect, a method of driving an array of electromechanical devices is provided, the method including performing an actuation operation on an electromechanical device within the array, where each actuation operation performed on the electromechanical device includes applying a release voltage across the electromechanical device, where the release voltage remains between a positive release voltage of the electromechanical device and a negative release voltage of the electromechanical device, and applying an address voltage across the electromechanical device, where the address voltage is either greater than a positive actuation voltage of the electromechanical device or less than a negative actuation voltage of the electromechanical device.

In another aspect, a display including a plurality of electromechanical display elements, is provided, the display including an array of electromechanical display elements, and driver circuitry configured to perform an actuation operation on an electromechanical device within the array, where each actuation operation performed on the electromechanical device includes applying a release voltage across the electromechanical device, where the release voltage remains between a positive release voltage of the electromechanical device and a negative release voltage of the electromechanical device, and applying an address voltage across the electromechanical device, where the address voltage is either greater than a positive actuation voltage of the electromechanical device or less than a negative actuation voltage of the electromechanical device In another aspect, a method of driving an electromechanical device in an array of electromechanical devices is provided, the electromechanical device including a first electrode in electrical communication with a segment line spaced apart from a second electrode in electrical communication with a common line, the method including applying a segment voltage on the segment line, where the segment voltage varies between a maximum voltage and a minimum voltage, and where a difference between the maximum voltage and the minimum voltage is less than a width of a hysteresis window of the electromechanical device, applying a reset voltage on the common line, where the reset voltage is configured to place the electromechanical device in an unactuated state, and applying an overdrive voltage on the common line, where the overdrive voltage is configured to cause the electromechanical device to actuate based upon the state of the segment voltage.

In another aspect, a method of driving an array of electromechanical devices is provided, the array including a plurality of common lines and a plurality of segment lines, each electromechanical device including a first electrode in electrical communication with a common line spaced apart from a second electrode in electrical communication with a segment line, the method including applying a segment voltage on each of the plurality of segment lines, where the segment voltage applied on a given segment line is switchable between a high segment voltage state and low segment voltage state, and simultaneously applying a release voltage on a first common line and an address voltage on a second common line, where the release voltage causes release of all actuated electromechanical devices along the first common line independent of the state of a segment voltage applied to each electromechanical device, and where the address voltage causes actuation of electromechanical devices dependent upon the state of the segment voltage applied to a given electromechanical device.

In another aspect, a display device is provided, including an array of electromechanical devices, the array including a plurality of common lines and a plurality of segment lines, each electromechanical device including a first electrode in electrical communication with a common line spaced apart from a second electrode in electrical communication with a segment line, and driver circuitry configured to apply high segment voltage and a low segment voltage on segment lines, and configured to apply release voltages and address voltages on common lines, where the driver circuitry is configured to simultaneously apply a release voltage along a first common line and an address voltage along a second common line, where the high and low segment voltages are selected such that the release voltages release electromechanical devices located along a common line regardless of the applied segment voltage, and the address voltages cause actuation of certain electromechanical devices along a common line dependent upon the applied segment voltage.

In another aspect, a method of balancing charges within an array of electromechanical devices, the array including a plurality of segment lines and a plurality of common lines, the method including performing a write operation on the common line, where performing a write operation includes selecting a polarity for the write operation based at least in part on charge-balancing criteria, performing a reset operation by applying a reset voltage across a common line, the reset voltage placing each of the electromechanical devices along a common line in an unactuated state, applying a hold voltage of the selected polarity across the common line, where the hold voltage does not cause any of the electromechanical devices along the common line to actuate, and simultaneously applying an overdrive voltage of the selected polarity across the common line and a plurality of segment voltages across the segment lines, where the segment voltages vary between a first polarity and a second polarity, and where the overdrive voltage causes the actuation of an electromechanical device when the polarity of the overdrive voltage and the polarity of the corresponding segment voltage are not the same.

BRIEF DESCRIPTION OF THE DRAWINGS

FIG. 10 is an illustration of a set of segment and common voltages that may be used to drive an interferometric modulator display using a low voltage drive scheme.

DETAILED DESCRIPTION OF THE PREFERRED EMBODIMENT

The following detailed description is directed to certain specific embodiments. However, the teachings herein can be applied in a multitude of different ways. In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

As displays based on electromechanical devices become larger, addressing of the entire display becomes more difficult, and a desired frame rate may be more difficult to achieve. In addition, as electromechanical display elements become smaller, their actuation time decreases, and care must be taken to avoid accidental or undesired actuation of the electromechanical display elements. A low voltage drive scheme, in which a given row of electromechanical devices is released before new information is written to the row, and in which the data information is conveyed using a smaller range of voltages, addresses these issues by allowing shorter line times. Furthermore, the low voltage drive scheme generally uses less power than previous drive schemes, and inhibits the onset of stiction failure within the electromechanical display elements.

Figure 1:
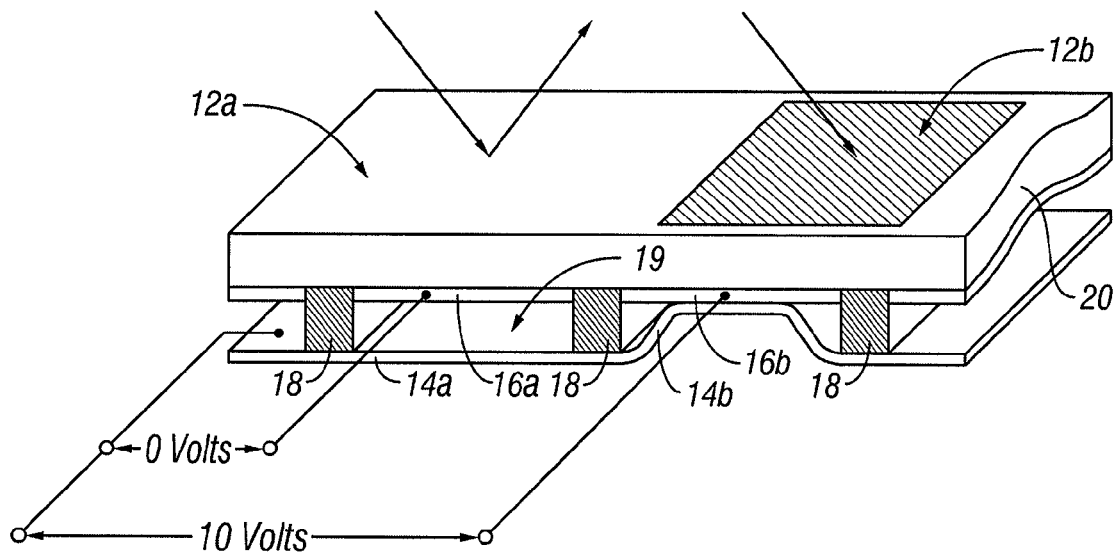
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed.

MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) to form columns deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
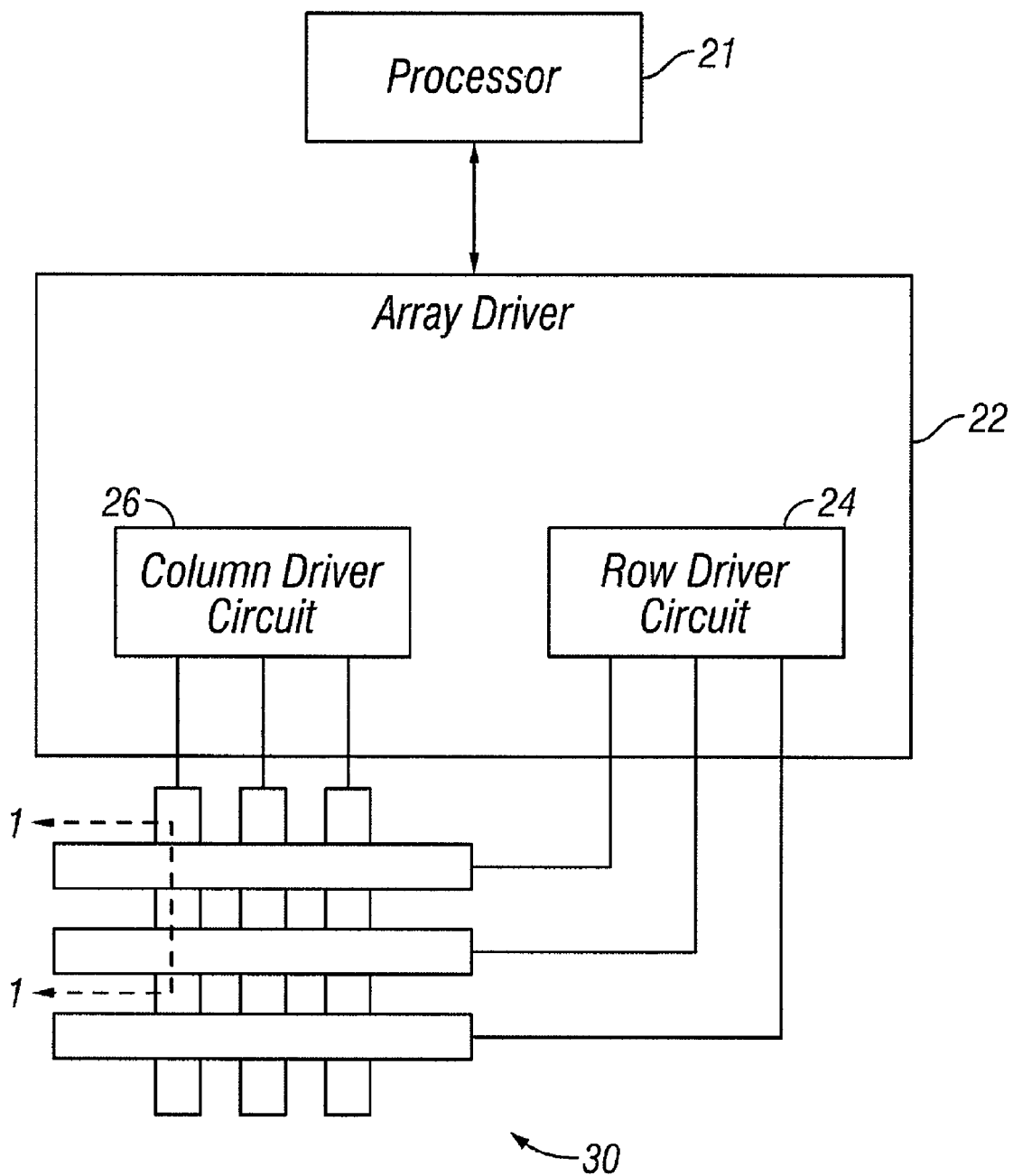
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The row driver circuit and column driver circuit 26 may be generically referred to as a segment driver circuit and a common driver circuit, and either of the row or columns may be used to apply segment voltages and common voltages. Furthermore, the terms "segment" and "common" are used herein merely as labels, and are not intended to convey any particular meaning regarding the configuration of the array beyond that which is discussed herein. In certain embodiments, the common lines extend along the movable electrodes, and the segment lines extend along the fixed electrodes within the optical stack. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
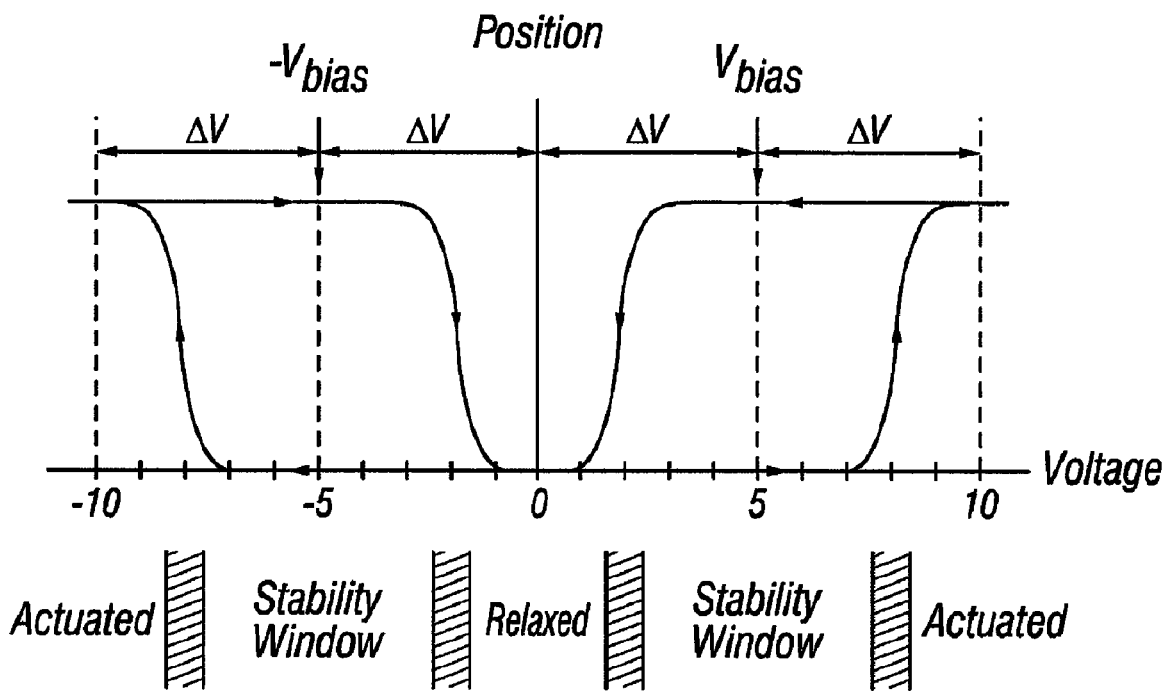
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display using a high voltage drive scheme.

FIG. 3 is a diagram of movable mirror position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window."

In certain embodiments, the actuation protocol may be based on a drive scheme such as that discussed in U.S. Pat.

No. 5,835,255. In certain embodiments of such drive schemes, for a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. When other lines are addressed by strobing a different row, the voltage across a non-strobed column line may be switched between a value within the positive stability window and a value within the negative stability window, due to changes in the bias voltage applied along the column line to address the strobed row in the desired manner. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in certain applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for a such a drive scheme, where the actuation protocol can be used for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
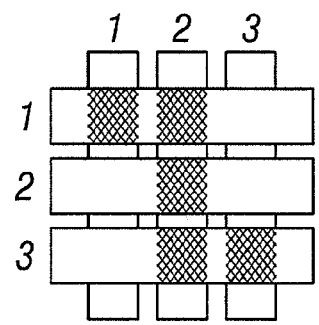
FIGS. 5A and 5B illustrate one exemplary timing diagram for row and column signals that may be used to write a frame of display data to the 3×3 interferometric modulator display of FIG. 2 using a high voltage drive scheme.
Figure 5B:
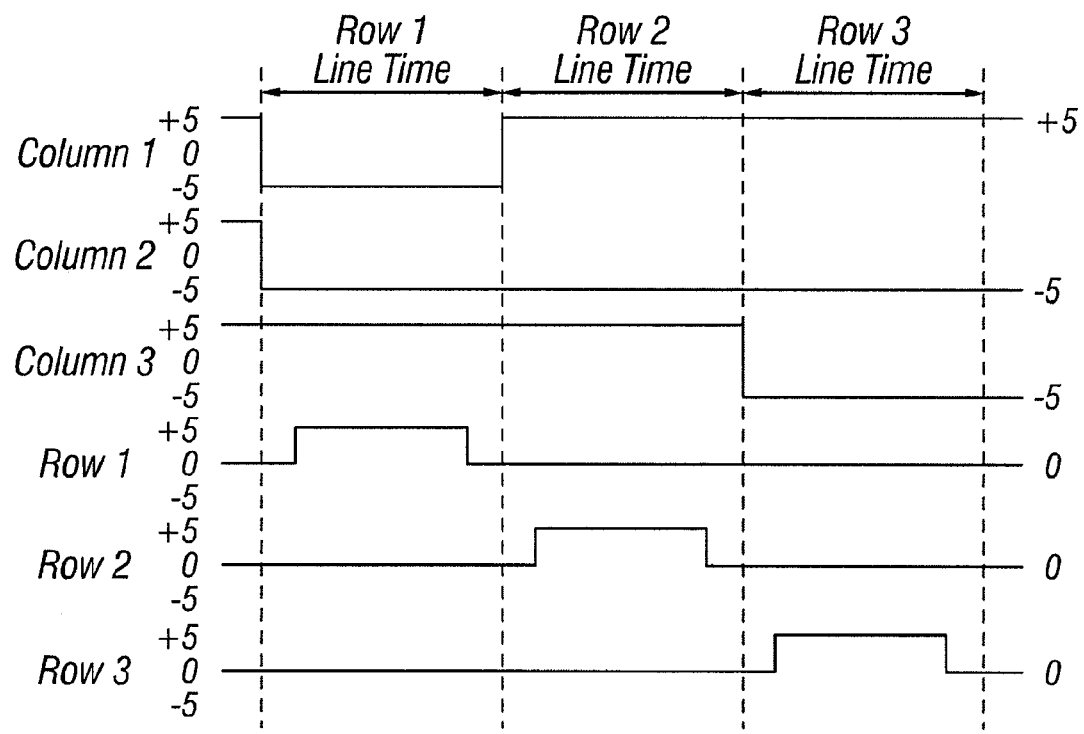

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above embodiment is an example only, and any actuation voltage method can be used with the systems and methods described herein.

Figure 6A:
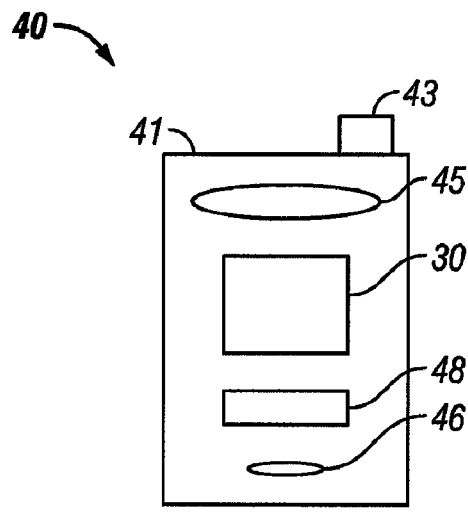
FIGS. 6A and 6B are system block diagrams illustrating an embodiment of a visual display device comprising a plurality of interferometric modulators.
Figure 6B:
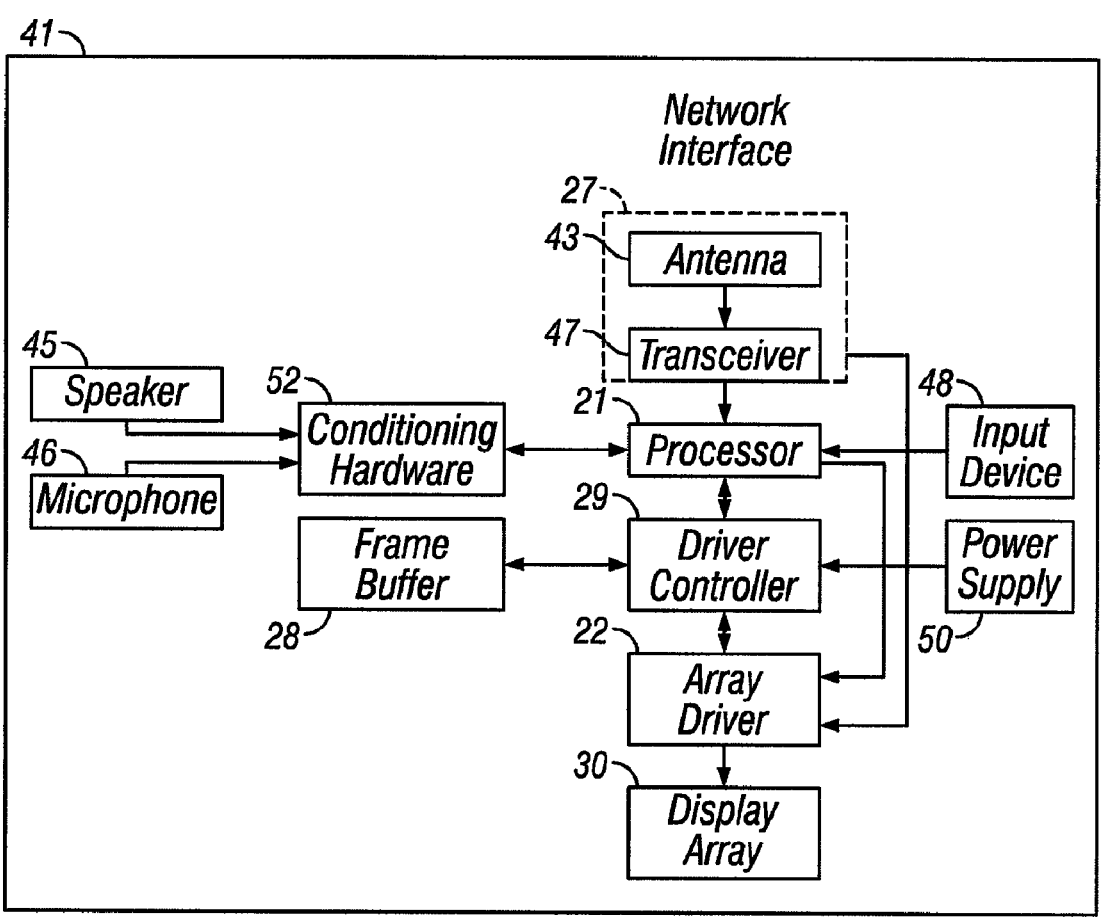

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

Figure 7A:
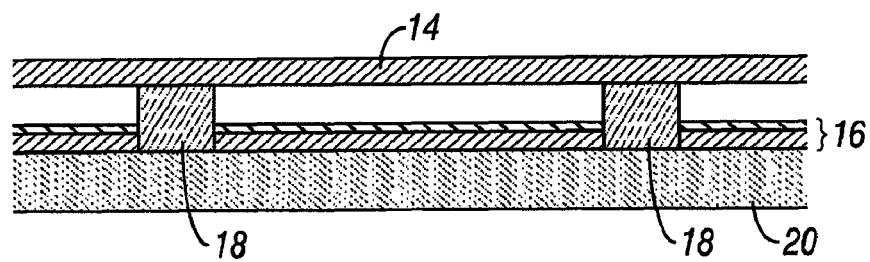
FIG. 7A is a cross section of the device of FIG. 1.
Figure 7B:
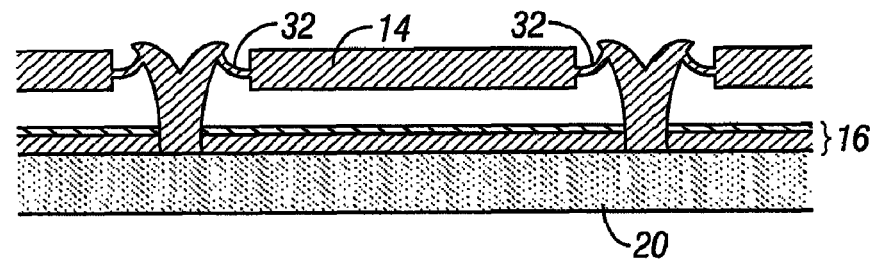
FIG. 7B is a cross section of an alternative embodiment of an interferometric modulator.
Figure 7C:
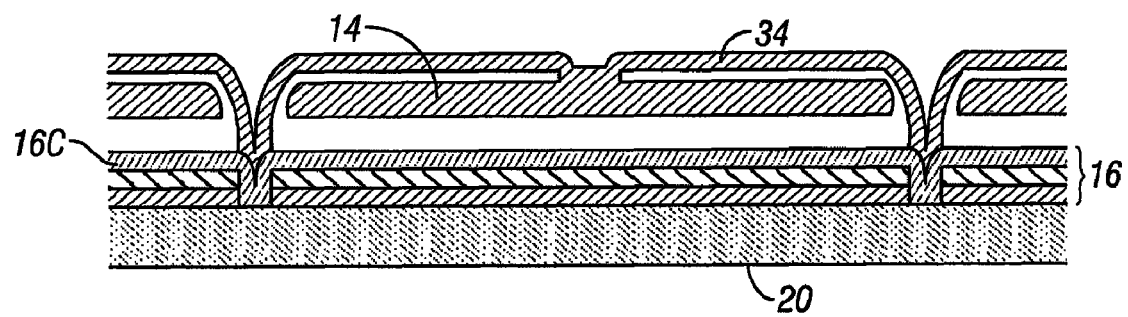
FIG. 7C is a cross section of another alternative embodiment of an interferometric modulator.
Figure 7D:
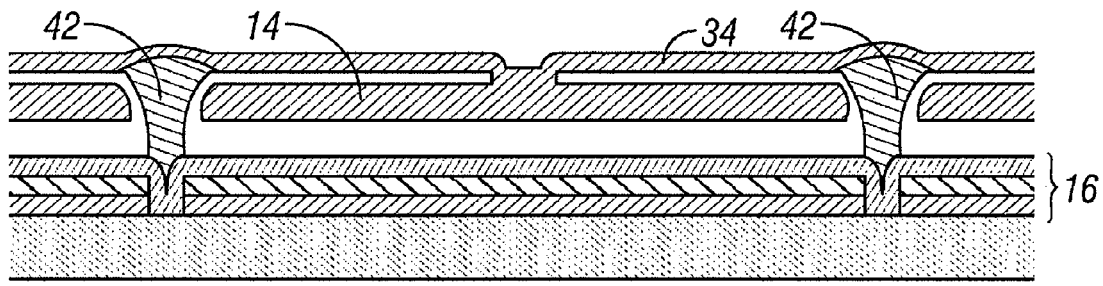
FIG. 7D is a cross section of yet another alternative embodiment of an interferometric modulator.
Figure 7E:
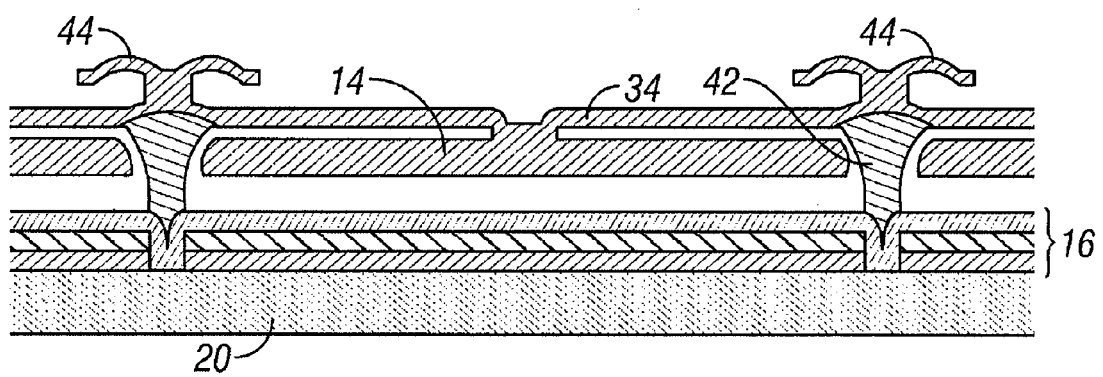
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 of each interferometric modulator is square or rectangular in shape and attached to supports at the corners only, on tethers 32. In FIG. 7C, the moveable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

In other embodiments, alternate drive schemes may be utilized to minimize the power required to drive the display, as well as to allow a common line of electromechanical devices to be written to in a shorter amount of time. In certain embodiments, a release or relaxation time of an electromechanical device such as an interferometric modulator may be longer than an actuation time of the electromechanical device, as the electromechanical device may be pulled to an unactuated or released state only via the mechanical restoring force of the movable layer. In contrast, the electrostatic force actuating the electromechanical device may act more quickly on the electromechanical device to cause actuation of the electromechanical device. In the high voltage drive scheme discussed above, the write time for a given line must be sufficient to allow not only the actuation of previously unactuated electromechanical devices, but to allow for the unactuation of previously actuated electromechanical devices. The release rate of the electromechanical devices thus acts as a limiting factor in certain embodiments, which may inhibit the use of higher refresh rates for larger display arrays.

Figure 8:
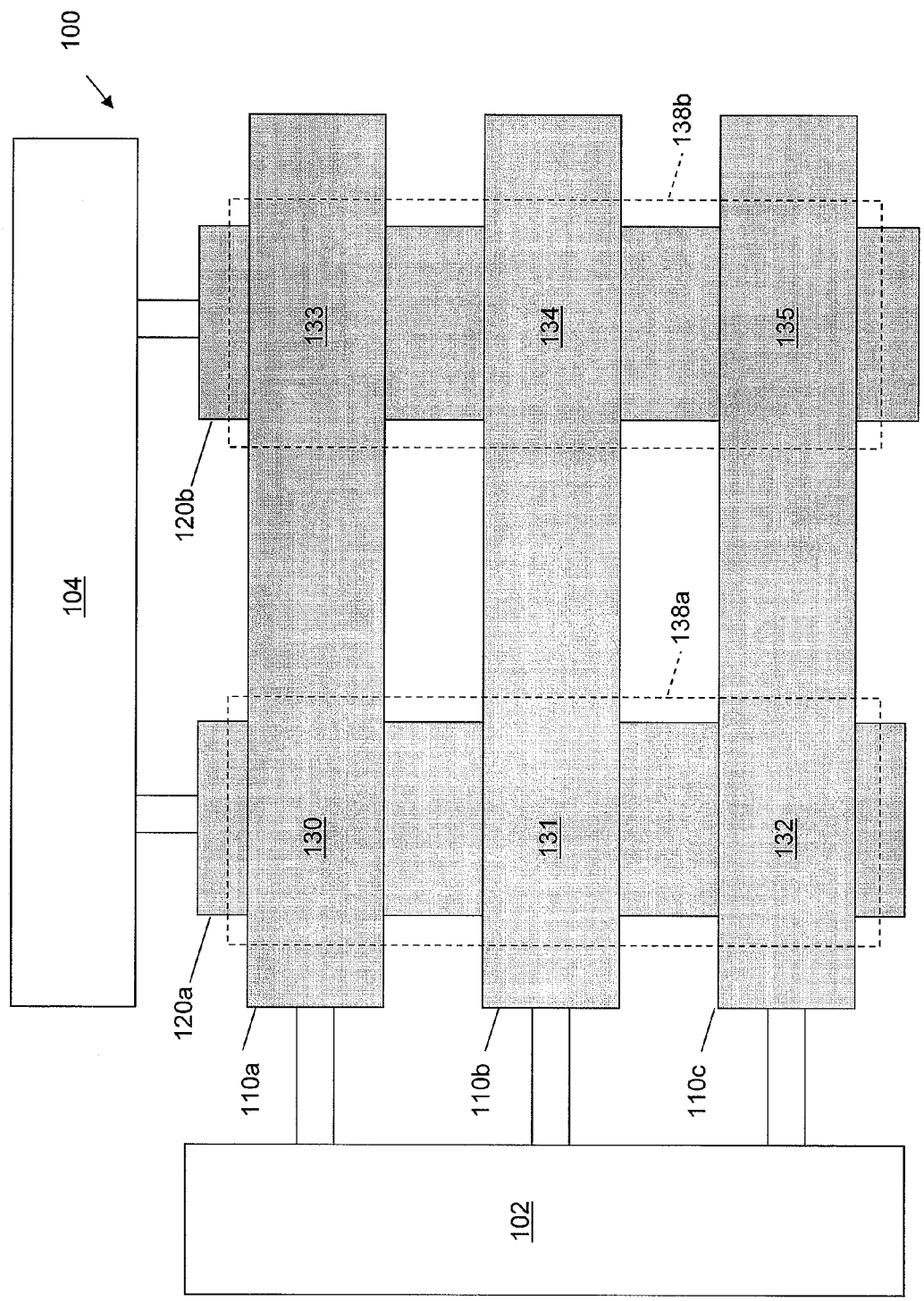
FIG. 8 is a schematic illustration of a 2×3 array of interferometric modulators.

An alternate drive scheme, referred to herein as a low voltage drive scheme, may provide improved performance over the drive scheme discussed above, in which the bias voltage is applied along both the common and segment lines. FIG. 8 illustrates an exemplary 2×3 array segment 100 of interferometric modulators, wherein the array includes three common lines 110a, 110b, and 110c, and two segment lines 120a, 120b. An independently addressable pixel 130, 131, 132, 133, 134, and 135 is located at each intersection of a common line and a segment line. Thus, the voltage across pixel 130 is the difference between the voltages applied on common line 110a and segment line 120a. This voltage differential across a pixel is alternately referred to herein as a pixel voltage. Similarly, pixel 131 is the intersection of common line 110b and segment line 120a, and pixel 132 is the intersection of column line 110c and segment line 120a. Pixels 133, 134, and 135 are the intersections of segment line 120b with common lines 110a, 110b, and 110c, respectively. In the illustrated embodiment, the common lines comprise a movable electrode, and the electrode in the segment lines are fixed portions of an optical stack, but it will be understood that in other embodiments the segment lines may comprise movable electrodes, and the common lines may comprise fixed electrodes. Common voltages may be applied to common lines 110a, 110b, and 110c by common driver circuitry 102, and segment voltages may be applied to segment lines 120a and 120b via segment driver circuitry 104.

In a bichrome display, each of the pixels 130-135 may be substantially identical, with similar or identical electromechanical properties. For example, the gap between the movable electrode and the optical stack when the electromechanical device is in the unactuated position may be substantially identical for each of the pixels, and the pixels may have substantially identical actuation and release voltages, and therefore substantially identical hysteresis windows. In a color display, the exemplary array segment 100 may comprise three colors of subpixels, with each of the pixels 130-135 comprising a subpixel of a particular color. The colored subpixels may be arranged such that each common line 110a, 110b, 110c defines a common line of subpixels of similar colors. For example, in an RGB display, pixels 130 and 133 along common line 110a may comprise red subpixels, pixels 131 and 134 along common line 110b may comprise green subpixels, and pixels 132 and 135 along common line 110a may comprise blue subpixels. Although depicted as being a tri-color display, any number of subpixels may be used in a given color pixel. Thus, the 2×3 array may in an RGB display represent two color pixels 138a and 138b, where the color pixel 138a comprises red subpixel 130, green subpixel 131, and blue subpixel 132, and the color pixel 138b comprises red subpixel 133, green subpixel 134, and blue subpixel 135.

In other embodiments, more or fewer colors of subpixels used, and the number of common lines per pixel adjusted accordingly. In still other embodiments, subpixels of more than one color may be arranged along a single common line. For example, in a four-color display, 2×2 regions of the display may form pixels, such that for example, pixel 130 may be a red subpixel, pixel 133 may be a green subpixel, pixel 131 may be a blue subpixel, and pixel 134 may be a yellow subpixel.

In one embodiment of an alternate drive scheme, the voltage $V_{SEG}$ applied on segment lines 120a and 120b is switched between a high segment voltage $VS_H$ and a low segment voltage $VS_L$. The voltage $V_{COM}$ applied on common lines 110a, 110b, and 110c is switched between 5 different voltages, one of which is a ground state in certain embodiments. The four non-ground voltages are a high hold voltage $VC_{HOLD\_H}$, a high address voltage $VC_{ADD\_H}$ (alternately referred to herein as an overdrive or select voltage), a low hold voltage $VC_{HOLD\_L}$, and a low address voltage $VC_{ADD\_L}$. The hold voltages are selected such that the pixel voltage will always lie within the hysteresis windows of the pixels (the positive hysteresis value for the high hold voltage and the negative hysteresis value for the low hold voltage) when appropriate segment voltages are used, and the absolute values of the possible segment voltages are sufficiently low that a pixel with a hold voltage applied on its common line will thus remain in the current state regardless of the particular segment voltage currently applied on its segment line.

In a particular embodiment, the high segment voltage $VS_H$ may be a relatively low voltage, on the order of 1V-2V, and the low segment voltage $VS_L$ may be ground. Because the high and low segment voltages are not symmetric about the ground, the absolute value of the high hold and address voltages may be less than the absolute value of the low hold and address voltages (as can be seen later with respect to, e.g., FIG. 9A). As it is the pixel voltage which controls actuation, not just the particular line voltages, this offset will not affect the operation of the pixel in a detrimental manner, but needs merely to be accounted for in determining the proper hold and address voltages.

The positive and negative hysteresis windows may be different for certain electromechanical devices, and an offset voltage along the common line may be used to account for that difference. In such an embodiment, when the low segment voltage is set to ground, the high and low hold voltages are dependent upon the high segment voltage $VS_H$, as well as an offset voltage $V_{OS}$ which may represent the midway point between the positive and negative hysteresis values and a bias voltage $V_{BIAS}$ which may represent the difference between the midpoint of the hysteresis window and the offset voltage $V_{OS}$. A suitable high hold voltage may be given by $$VC_{HOLD\_H} = \frac{1}{2}VS_H - V_{OS} + V_{BIAS}$$

and a suitable low hold voltage may be given by $$VC_{HOLD\_L} = \frac{1}{2}VS_H - V_{OS} - V_{BIAS}.$$

High and low address voltages $VC_{ADD\_H}$ and $VC_{ADD\_L}$ may be obtained by adding an additional voltage $V_{ADD}$ to the high hold voltage, and subtracting $V_{ADD}$ from the low hold voltage. It will be noted that the voltages may be defined more generically to deal with embodiments where the low frequency voltage is not set to ground by replacing the term $\frac{1}{2}VS_H$ with the term $\frac{1}{2}\Delta V$, where $\Delta V$ represents the difference between any given high and low segment voltages. In addition, as will be discussed in greater detail below, a hold voltage need not be placed in the middle of a hysteresis window, and the value selected for $V_{BIAS}$ may be larger or smaller than the exemplary value discussed above.

Figure 9:
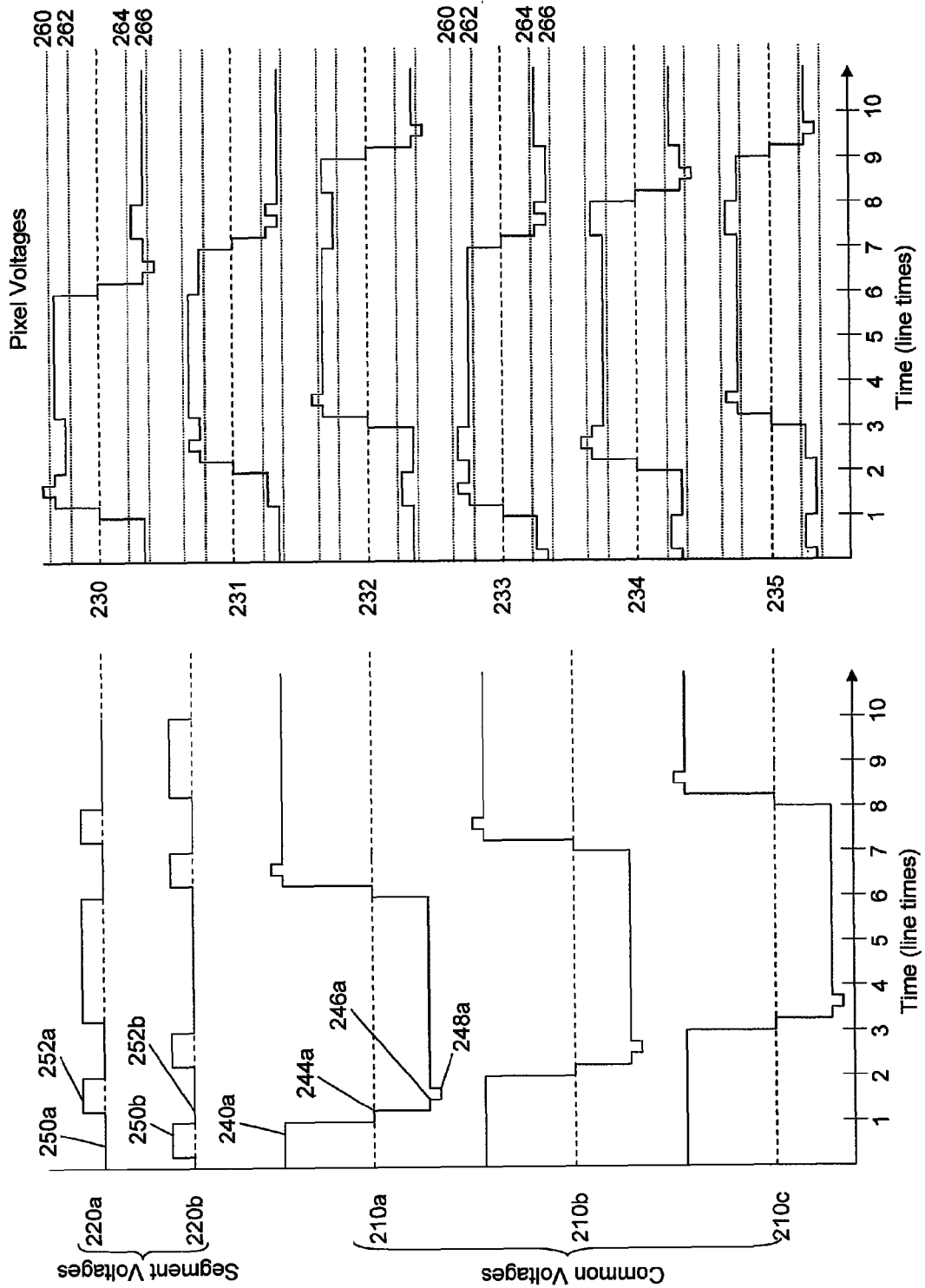
FIG. 9A illustrates an exemplary timing diagram for segment and common signals that may be used to write frames of display data to the 2×3 display of FIG. 8 using a low voltage drive scheme.
FIG. 9B illustrates the resultant pixel voltages across the pixels of the array of FIG. 8 in response to the driving signals of FIG. 9A.

FIG. 9A illustrates exemplary voltage waveforms which may be applied on the segment lines and common lines of FIG. 8, and FIG. 9B illustrates the resulting pixel voltages across the pixels of FIG. 8 in response to the applied voltages. Waveform 220a represents the segment voltage as a function of time applied along segment line 120a of FIG. 8, and waveform 220b represents the segment voltage applied along segment line 120b. Waveform 210a represents the common voltage applied along column line 110a of FIG. 8, waveform 210b represents the common voltage applied along column line 110b, and waveform 210c represents the common voltage applied along column line 110c. Waveform 230 represents the pixel voltage across pixel 130, and waveforms 231-235 similarly represent the pixel voltages across pixels 131-135, respectively.

In FIG. 9A, it can be seen that each of the common line voltages begins at a high hold value $VC_{HOLD\_H}$ such as high hold value 240a of waveform 220a. At a point during the application of this high hold value $VC_{HOLD\_H}$, the segment line voltage for segment line 120a (waveform 220a) is at a low segment voltage $VS_L$ 250a, and the segment line voltage for segment line 120b (waveform 220a) is at a high segment voltage $VS_H$ 250b. Thus, pixel 130 is exposed to the largest voltage differential during the application of $VC_{HOLD\_H}$ for the given $V_{SEG}$ parameters, and it can be seen in waveform 230 (the difference between the waveforms 210a and 220a) that this voltage differential across pixel 130 does not move the pixel voltage beyond a negative actuation voltage 264. Similarly, pixel 133 is exposed to the smallest voltage differential during the application of $VC_{HOLD\_H}$ for the given $V_{SEG}$ parameters, and the voltage across pixel 133 does not move beyond the negative release threshold, as can be seen in waveform 233. Thus, the state of the pixels 110 and 113 along common line 110a remains constant during application of the high hold voltage $VC_{HOLD\_H}$ along common line 110a, regardless of the state of the segment voltages.

The common line voltage on common line 110a (waveform 210a) then moves to a ground state 244a, causing release of the pixels 130 and 133 along common line 110a. This can be seen in FIG. 9B, where the pixel voltages seen in waveforms 230, 233 move beyond the negative release voltage, thereby releasing pixels 130 and 133 if they were previously in an actuated state. It can be noted in this particular embodiment that the segment voltages are both low segment voltages $VS_L$ 250a and 250b at this point (as can be seen in waveforms 220a and 220b), placing the pixel voltage exactly at 0V, but given proper selection of voltage values, the pixels would release even if the either of the segment voltages was at the high segment voltage $VS_H$.

The common line voltage on line 110a (waveform 210a) then moves to a low hold value $VC_{HOLD\_L}$ 246a. When the voltage is at the low hold value 246, the segment line voltage for segment line 120a (waveform 210a) is at a high segment voltage $VS_H$ 252a, and the segment line voltage for segment line 120b (waveform 210b) is at a low segment voltage $VS_L$ 250b. The voltage across each of pixels 130 and 133 moves past the positive release voltage 262 to within the positive hysteresis window without moving beyond the positive actuation voltage 260, as can be seen in waveforms 230 and 233 of FIG. 9B. Pixels 130 and 133 thus remain in their previously released state.

The common line voltage on line 110a (waveform 210a) is then decreased to a low address voltage $VC_{ADD\_L}$ 248a. The behavior of the pixels 130 and 133 is now dependent upon the segment voltages currently applied along their respective segment lines. For pixel 130, the segment line voltage for segment line 120a is at a high segment voltage $VS_H$ 252a, and the pixel voltage of pixel 130 increases beyond the positive actuation voltage 260, as can be seen in waveform 230 of FIG. 9B. Pixel 130 is thus actuated at this time. For pixel 133, the pixel voltage (waveform 233) does not increase beyond the positive actuation voltage, so pixel 133 remains unactuated.

Next, the common line voltage along line 110a (waveform 210a) is increased back to the low hold voltage 246a. As previously discussed, the voltage differential across the pixels remains within the hysteresis window when the low hold voltage 226a is applied, regardless of the segment voltage. The voltage across pixel 130 (waveform 230) thus drops below the positive actuation voltage 260 but remains above the positive release voltage 262, and thus remains actuated. The voltage across pixel 133 (waveform 233) does not drop below the positive release voltage 262, and will remain unactuated.

FIG. 10 is a table illustrating pixel behavior as a function of voltages applied on the common and segment lines. As can be seen, application of a release common voltage $VC_{REL}$, which as noted above may be a ground state in many embodiments, will always result in release of the pixel, whether the segment voltage is at a high segment voltage $VS_H$ or a low segment voltage $VS_L$. Similarly, application of a hold voltage ($VC_{HOLD\_H}$ or $VC_{HOLD\_H}$) along a common line will maintain a pixel in a stable state regardless of the segment voltage $VS_H$ or $VS_L$ applied, and not cause an unactuated pixel to actuate, or an actuated pixel to unactuate. When a high address $VC_{ADD\_H}$ voltage is applied along a common line, a low segment voltage $VS_L$ can be applied along segment lines to cause desired pixels along that common line to actuate, and a high segment voltage $VS_H$ can be applied along the other segment lines to cause the remaining pixels to remain unactuated. When a low address voltage $VC_{ADD\_L}$ voltage is applied along a common line, application of a high segment voltage $VS_H$ will cause actuation of desired pixels along that common line to actuate, and a low segment voltage $VS_L$ will cause pixels to remain unactuated.

In the illustrated embodiment, similar common voltages are applied on common lines 110b, and 110c, as can be seen in waveforms 210b and 210c, which are identical to waveform 210a but temporally offset by one and two line times, respectively. As only one common line is exposed to an addressing voltage at a time in this embodiment, only that line will be written to, and the segment voltages applied during the application of the addressing voltage are selected to write the desired data to the common line currently being addressed. It can also be seen that the entire release and write process for a given column line is performed during a single line time in the embodiment of FIGS. 9A and 9B. In other embodiments, portions of this process may be extended across multiple line times, as will be discussed in greater detail below.

Once all the common lines have been addressed, the initial common line 110a may be addressed again, beginning the process of writing another frame. It can be seen that in the second write process on the first common line 110a (waveform 210a), a positive hold and address voltage are used. It can also be seen that during a negative polarity write cycle, when the low hold and address voltages are used, a high segment voltage will cause actuation of the pixel along that segment line. Similarly, during a positive polarity write cycle, the low segment voltage will cause actuation of the pixel along that segment line, because the absolute value of the pixel voltage, the voltage differential between the voltages applied on the common and segment lines for that pixel, will be as large as possible. Because this meaning of the state of the segment data (referred to herein as the "sense" of the data) alternates in this embodiment on a frame to frame basis, the polarity of the write procedures must be tracked so that the segment voltages can be properly formatted.

Multiple modifications can be made to the low voltage drive scheme described above. In the drive scheme of FIGS. 9A and 9B, the offset voltage has been set at 0V for the purposes of simplification, but other suitable offset voltages may be used. For example, when the common lines are lines of interferometric modulators having differing electromechanical characteristics, such as subpixels configured to reflect different colors, the actuation, release and offset voltages may be different. Thus, in an embodiment in which the common lines 110a, 110b, and 110c comprise different colors of subpixels, both the offset voltage and the bias voltages may be different for different common lines, resulting in potentially different values for each of the 5 voltages which can be applied on the common line. The use of an offset voltage may require the inclusion of an additional voltage regulator within the driver circuitry to supply the offset voltage, and the use of multiple offset voltages for each color may require an additional voltage regulator per color.

In addition, in other embodiments, the segment voltage may not vary between a low segment voltage and ground, but may instead vary between a high and low segment voltage such as a positive segment voltage and a negative segment voltage. In an embodiment in which the absolute value of the high segment voltage is substantially equal to the absolute value of the low segment voltage (where the segment voltages are centered about ground), the positive and negative hold and address voltages may be substantially symmetrical about the offset voltage. In other embodiments, both the segment voltages may have the same polarity, such as an embodiment where the high segment voltage is set to 2.5V, and the low segment voltage is set to 0.5 volts. In certain embodiments, however, minimizing the absolute value of the segment voltages may simplify the segment drivers.

In the embodiment illustrated in FIG. 9A, a first frame is written by writing to the each of the common once using a series of address voltages having the same polarity. The polarity of the second frame is then inverted, by writing to each of the common lines once using a series of address voltages having the opposite polarity. The polarity may continue to be switched at the end of the write procedures for each frame. This frame inversion may help to balance charge accumulation across the pixels of the device by alternating the polarity of the write procedures. In other embodiments, however, the polarity may be inverted prior to the end of the process of writing a full frame, such as on a line by line basis. In other embodiment, where the common lines are arranged in color groups, with each group including one common line of a particular color of interferometric modulators, the polarity may be altered after each color group.

Figure 11:
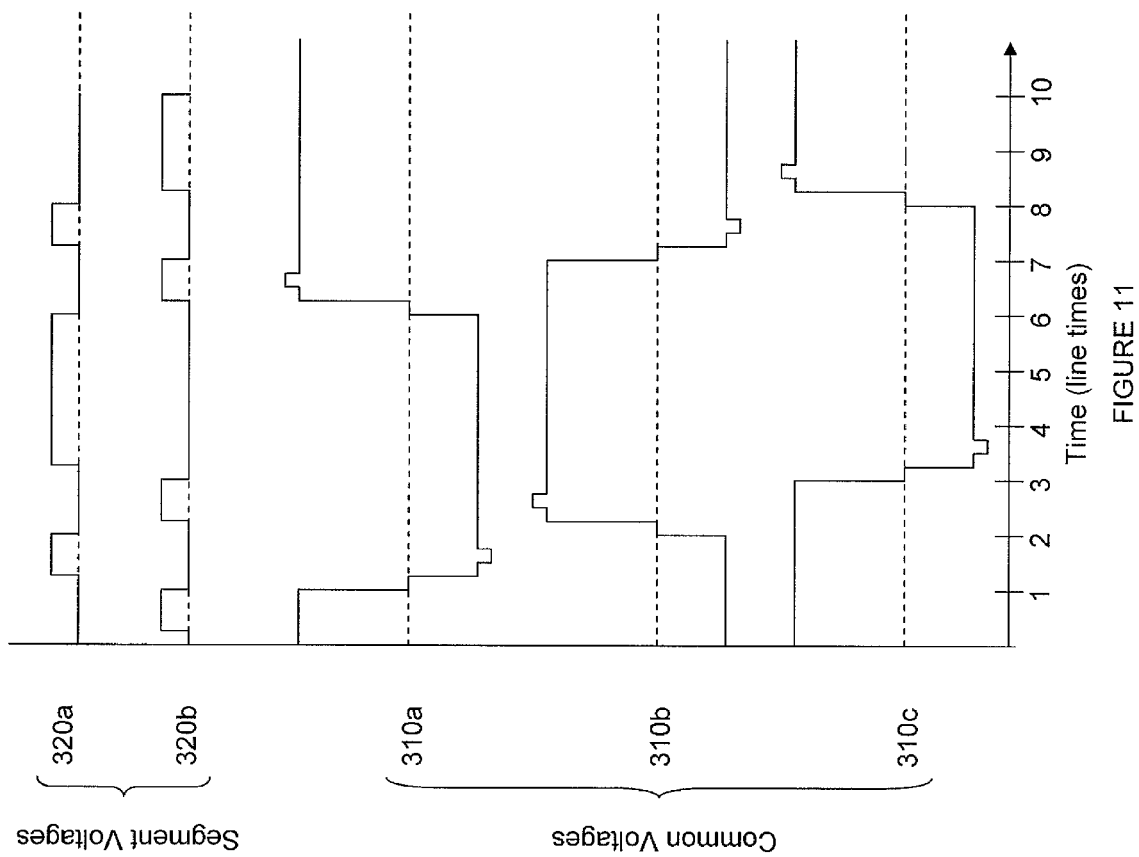
FIG. 11 illustrates an alternate timing diagram for segment and common signals which utilizes line inversion.

FIG. 11 illustrates voltage signals usable in such an embodiment. Voltages 320a and 320b are segment voltages which vary between a high segment voltage and ground, as discussed above with respect to voltages 220a and 220b of FIG. 9A. Voltage 320a may be applied along segment line 320a, and voltage 320b may be applied along segment line 320b. Similarly, voltages 310a, 310b, and 310c may be applied along common lines 110a, 110b, and 110c, respectively.

It can be seen that voltage 310a first includes a write procedure having a negative polarity performed along common line 110a. Subsequently, a write procedure having a positive polarity is performed along common line 110b using voltage 310b. The polarity of the write procedure continues to alternate on a line by line basis. In the illustrated embodiment, because there are an odd number of common lines, the polarity of write procedures performed along a given common line will alternate over time, as well. In embodiments in which there is an even number of common lines, the polarity of the write procedure on the final common line may be used as the polarity of the next write procedure on the first common line, so as to maintain the alternating polarity along a given common line. Alternatively, the polarity of a particular write procedure, such as the write procedure for the first line in a frame may be selected on a pseudo-random basis. The polarity of subsequent write procedures in that frame may be alternated on a line-by-line or color group basis, or may themselves be selected on a pseudo-random basis.

In the line inversion embodiment of FIG. 11, the sense of the data will vary on a line by line basis, rather than a frame by frame basis, but the polarity of the current write voltage may nevertheless be tracked in a similar manner and utilized to appropriately determine the data signals to be sent along the segment lines.

In further embodiments, a low voltage drive scheme may be modified to perform at least some of the steps leading up to application of the address voltage on common lines other than the common line currently being addressed. In particular embodiments, extending the release and write procedure across multiple line times may allow faster refresh rates for a display. Because all voltages other than those used for the high and low addressing voltages are selected to have no effect not to actuate the interferometric modulators, regardless of the addressing voltage, the segment voltages can be set to appropriate values to write data to the common line currently being addressed, without affecting the state of pixels along other common lines.

Figure 12:
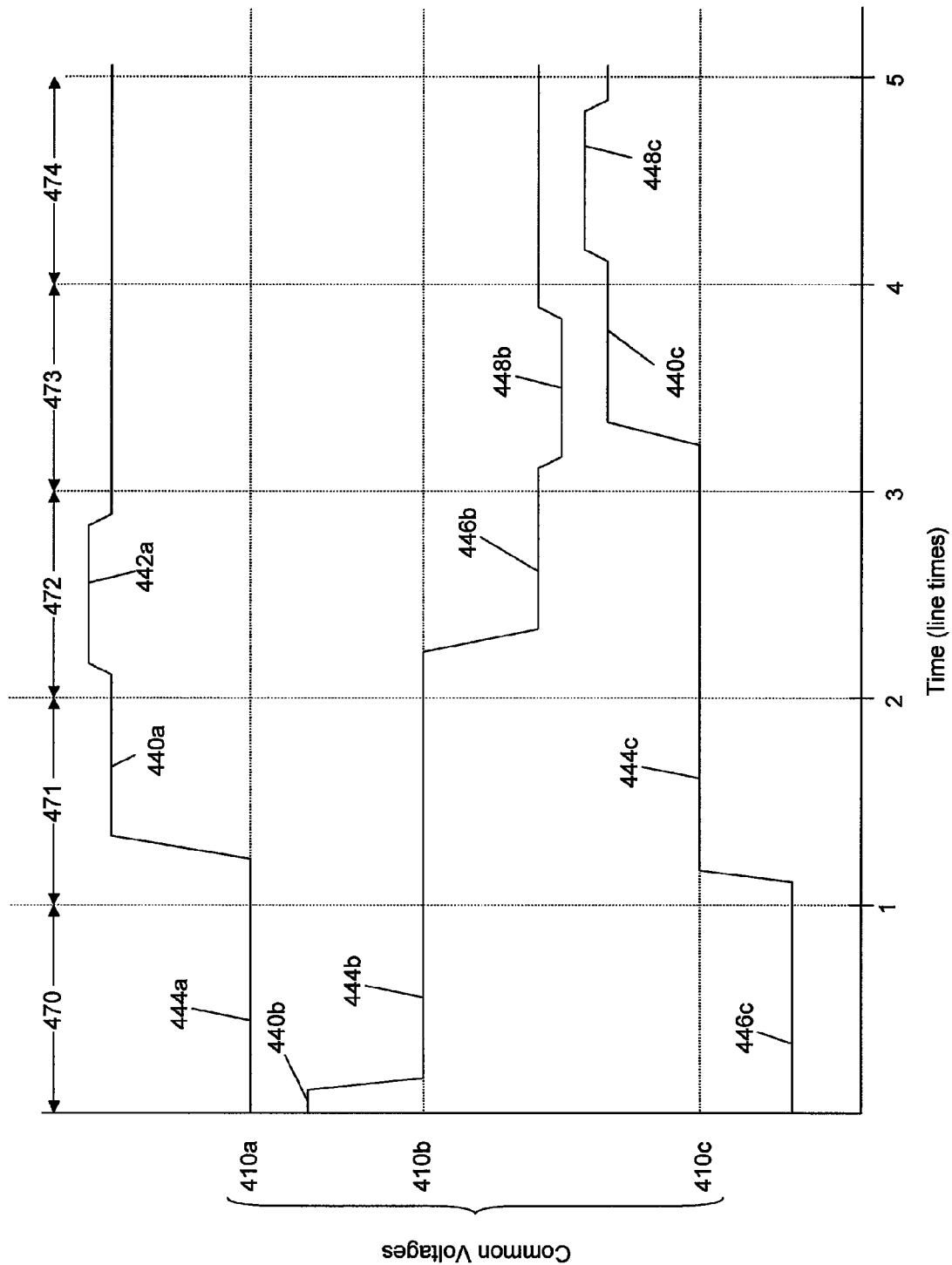
FIG. 12 illustrates a timing diagram for column signals which include extended write times.

FIG. 12 illustrates an embodiment in which a release and write procedure is performed over three line times. In one embodiment, the common line two lines ahead of the line currently being written to is released, and the common line one line ahead of the line currently being written to is moved to an appropriate hold voltage. It will be understood, however, that the common lines may be addressed in any appropriate order, and that the common lines need not be addressed in a sequential basis as shown in the previously illustrated embodiments.

FIG. 12 depicts waveforms representing voltages which may be applied on three different common lines, such as common lines 110a, 110b, and 110c. In particular, waveform 410a represents voltages which may be applied on a common line having red subpixels, waveform 410b represents voltages which may be may be applied on a common line having green subpixels, and waveform 410c represents voltages which may be applied on a common line having blue subpixels. In addition to modifications to the values of the hold and release voltages based on possible differences in appropriate offset voltages and bias voltages for interferometric modulators of different colors, other parameters of the waveforms 410a, 410b, and 410c may be varied, as well.

In the first line time 470 illustrated in FIG. 12, it can be seen that the waveform 410a is at a ground state 444a for the duration of the line time 470. As can best be seen with respect to waveform 410b, these waveforms may remain in the ground state for a length of time greater than a single line time. By applying the ground voltage on the common line for longer than a single line time, release of interferometric modulators having a longer release time than actuation time can be ensured. In other embodiments, the transition between a high hold voltage and a low hold voltage may result in a voltage within the release window of the pixel being applied for a sufficient amount of time to cause the device to release. Thus, in certain embodiments, a fixed release voltage such as voltage 444a need not be applied for a specific period of time on the column line.

In the second line time 471, the voltage 410a is increased to a high hold value 440a. Because the increase to the high hold value 440a will not result in actuation of any of the interferometric modulators, the voltage need not remain at the high hold value 440a for as long as it remains at the ground value 444a. The voltage 410b remains at the ground state 444b during this line time 471, and the voltage 410c is increased from the low hold state 446c to the ground state 444c.

In the third line time 472, the voltage 410a is increased from the high hold voltage 440a to a high address or overdrive voltage 442a for a period of time sufficient to ensure that all pixels along common line 110a intended to be actuated will be actuated. A positive polarity write procedure is thus performed, wherein any pixel in common line 110a located along a segment line where the low segment voltage is applied will be actuated, and any pixel located along a segment line where the high segment voltage is applied will remain unactuated. The voltage is then lowered back down to the high hold voltage 440a. In this line time 472, the voltage 410b is lowered to a low hold voltage 446b, and the voltage 410c remains at ground state 444c.

In the fourth line time 473, a negative polarity write procedure is performed along column line 110b, wherein the voltage 410b is decreased from low hold voltage 446b to low address voltage 448b for a period of time sufficient to actuate desired pixels along common line 110b.

In the fifth line time 474, a positive polarity write procedure is performed along column line 110c in a similar manner to that discussed above with respect to the positive polarity write procedure performed along column line 110a in third line time 472.

Thus, even though the complete release and write procedure spans multiple line times, the release procedure and the application of the hold voltage affect pixels in a consistent manner independent of the segment voltage when the segment voltages are properly selected. These procedures can thus be applied to any desired common line regardless of the data being written to a common line during a particular line time. The line time can thus be made a function only of the write time to ensure actuation, rather than a function of the release time, as well.

Figure 13:
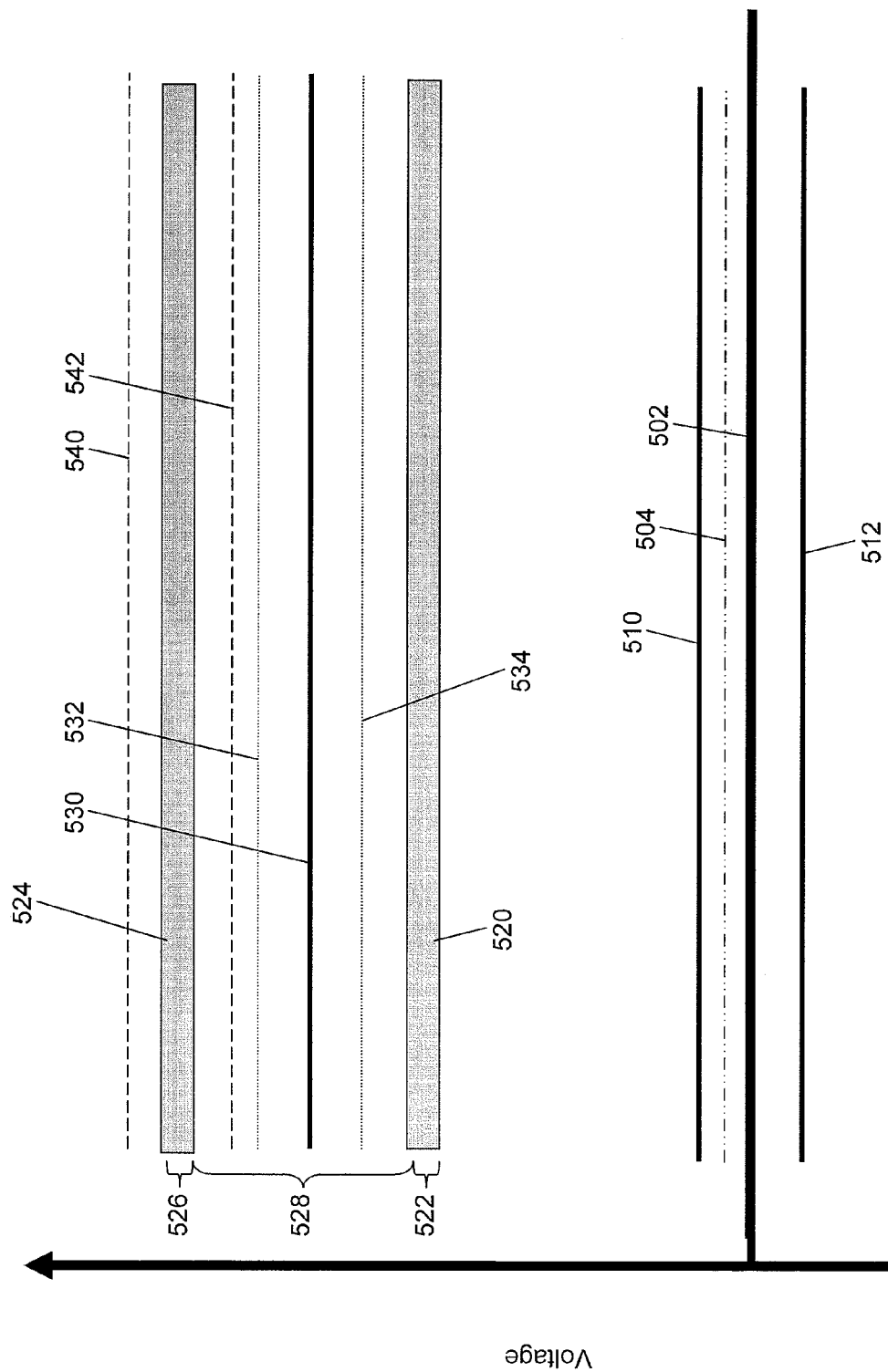
FIG. 13 illustrates the relationships of several segment, column, or pixel voltages relative to a positive hysteresis window of an electromechanical device.

As noted above, proper selection of the voltage values is beneficial. Just as the actuation and release voltages may vary for interferometric modulators of different colors, manufacturing variances or other factors may lead to interferometric modulators of the same color having some variance in actuation or release voltages. The actuation voltages and release voltages may thus be treated as a small range of voltages. Some margin of error may also be assumed, and used to define a buffer between expected values for the various voltages. FIG. 13 illustrates a range of voltages which can be applied at various times, spanning primarily positive voltages, in contrast to FIG. 3, which illustrates both positive and negative voltage ranges.

A ground voltage 502 is illustrated, as well as an offset voltage $V_{OS}$ 504. A high segment voltage $VS_H$ 510, which in the illustrated embodiment is positive, and a low segment voltage $VS_L$ 512, which in the illustrated embodiment is negative, are shown. The absolute value of the segment voltages 510, 512 is smaller than the DC release voltages in both polarities, and the offset voltage is thus relatively small. The positive release voltage 520 is shown having a width of 522, due to variance in the release voltage on the line or array of interferometric modulators. Similarly, the positive actuation voltage 524 has an illustrated width of 526. The high hold voltage $VC_{HOLD\_H}$ 530 falls within the hysteresis window 528 extending between the positive actuation voltage 524 and the positive release voltage 520.

Line 532 represents the pixel voltage when the common line voltage is set to high hold voltage 530 and the segment line voltage is set to the high segment voltage $VS_H$, and line 534 represents the pixel voltage when the common line voltage is set to high hold voltage 530 and the segment line voltage is set to the low segment voltage $VS_L$. As can be seen, both lines 532 and 534 lie within the hysteresis window 528, as well, ensuring that the pixel voltage remains within the hysteresis window when the high hold voltage $VC_{HOLD}$ is applied along the common line.

Line 540 represents the pixel voltage when the high addressing or overdrive voltage $VC_{ADD\_H}$ is applied along the common line, and the segment voltage is the low segment voltage $VS_L$. Line 542 represents the pixel voltage when the high addressing or overdrive voltage $VC_{ADD\_H}$ is applied along the common line, and the segment voltage is the high segment voltage $VS_H$. As can be seen, line 540 is located above the positive actuation voltage 524, and will therefore result in an actuation of the pixel. Line 542 is located within the hysteresis window 528, and will not result in a change in the state of the pixel. In a particular embodiment in which the high overdrive voltage is given by $VC_{ADD\_H}=VC_{HOLD\_H}+2VS_H$, it will be understood that the line 542 will be located at the same location as line 534. In an embodiment in which the segment voltage is not centered around ground, the above equation may more generally be expressed by $VC_{ADD\_H}=VC_{HOLD\_H}+\Delta VS$, where $\Delta VS$ is the segment voltage swing given by $\Delta VS=VS_H-VS_L$.

It can be seen in FIG. 13 that a minimum value for the voltage swing $\Delta VS$ may be given by the variation in the actuation voltages. Since the voltage swing $\Delta VS$ is in certain embodiments the same for positive and negative write procedures, the larger of the variation in the positive and negative actuation voltages may be a minimum value for $\Delta VS$. Furthermore, since $\Delta VS$ is in certain embodiments the same for each of the common lines of differently colored subpixels, the subpixel color with the largest variation in actuation times over the array may control the minimum value for the voltage swing $\Delta VS$. In certain embodiments, an additional buffer value is utilized in determining the various voltages, to avoid unintentional actuation of pixels.

The actuation time is dependent also upon the addressing voltage (alternately referred to as the overdrive voltage, as noted above), as an increased addressing voltage will increase the rate of charge flow to the interferometric modulator, increasing the electrostatic force acting on the movable layer. In particular, if the distance between the addressing voltage and the outer range of the actuation voltages is made larger, the actuation time of the pixels may be increased due to the increase in electrostatic force seen by all of the addressed pixels. If the actuation voltage window can be made as small as possible, it can be ensured that each of the pixels will see additional electrostatic force for a given voltage swing, and the line time may be reduced accordingly.

At noted above, the use of a low voltage drive scheme such as the one discussed above may provide multiple advantages over the high-voltage drive scheme. One notable advantage is the reduced power consumption under most circumstances. Under the high voltage drive scheme, the energy needed to "rip" or render an image is dependent on the current image on the display array, and controlled by the energy required to switch the segment voltages from their previous value to their intended value. Because the switch in segment voltages in the high voltage drive scheme generally requires a switch between the positive bias voltage and the negative bias voltage, the segment voltage swing is on the order of roughly 12 volts, assuming a bias voltage of roughly 6 volts. In contrast, the segment voltage swing in the low voltage drive scheme may be on the order of roughly 2 volts. The energy required to rip an image is thus is reduced by a factor of up to $(2/12)^2$, a significant energy savings.

In addition, the use of low voltage along the segment lines reduces the risk of unintended pixel switching due to coupling of the segment signals into the common lines. The amplitude and duration of any spurious signals resulting from cross-talk is reduced, lowering the likelihood of false pixel switching. This also lessens constraints on resistance throughout the array and in the periphery, allowing the use of materials and designs having higher resistance, or the use of narrower routing lines in the periphery of the array.

The range of usable voltages within the hysteresis window is also increased. Because the high voltage drive scheme discussed above does not intentionally unactuate and reactuate an already actuated pixel when the pixel is to remain actuated across two consecutive frames, unintended actuation of the pixel must be avoided. The use of a bias voltage significantly higher than the DC release voltage can mitigate this problem by ensuring that the switching between positive and negative hysteresis values is sufficiently fast, but doing so limits the usable bias voltages to within the flash bias window, which is smaller than the DC hysteresis window and is image dependent. In contrast, because each pixel is released for a period of time before reactuation in the low voltage drive scheme, unintentional release is not a concern, and the entire DC hysteresis window can be used.

The low voltage segment driver circuitry may also reduce the cost of the driver circuitry. Because of the lower voltages used, the segment driver circuitry can be build with digital logic circuitry. This may be particularly useful in large panels having multiple integrated circuits driving the panel. Some additional complexity is introduced in the common driver circuitry, as the common driver circuitry is configured to output five different voltages on a given common line, but this complexity is offset by the simplification of the segment driver circuitry.

The low voltage driver circuitry also permits the use of smaller, faster interferometric modulator pixels. The high voltage drive scheme may become impractical for smaller interferometric modulator elements. For example the use of interferometric modulators at or below 45 μm pitch may be impractical using a high voltage drive scheme, due in part to the actuation speed of the pixels, which could release too quickly. In contrast, interferometric modulators at or below 38 μm pitch are usable using a low voltage drive scheme such as the drive schemes discussed herein.

The line time of the interferometric modulators can be significantly reduced, as well. Using the high voltage drive scheme may be difficult for line times less than 100 μs on a display, but using the low voltage drive scheme, line times less than 10 μs are possible. In certain embodiments, the line time required by the low voltage drive schemes may be reduced to a point where the content in a given frame is written twice, once using a positive polarity, and once using a negative polarity. This double writing process is an ideal charge balancing process, as it is not dependent upon the probability of charge balancing over a large number of frames. Rather, each pixel is charge balanced within each frame by writing in both positive and negative polarities.

As can be seen in, for example, FIG. 13, while the pixel remains in a constant state in terms of actuation during application of the hold voltage, the applied voltage across the pixel may constantly alternate between two voltages within the hysteresis window due to application of alternating segment voltages over the corresponding segment line. When the pixel is in an unactuated state, the position of the movable layer is determined based upon a position which equalizes the mechanical restoring force and the electrostatic force resulting from the pixel voltage differential. Because the color reflected by an interferometric modulator is a function of the position of the movable layer relative to the optical stack, this variation in position can result in a variation in the color reflected by the interferometric modulator in an actuated state between two unactuated colors.

In an embodiment with frame inversion, the constant polarity across regions of the array during a given frame may cause some visible flicker of the segment lines, as a given segment voltage will affect almost all unactuated pixels along a segment line in the same manner. In some embodiments, line inversion of the type discussed above may mitigate this flicker, as adjacent pixels along a segment line may be affected in opposite ways by a given segment voltage, producing a much finer visual pattern which may appear to blend the two unactuated color states together. In other embodiments, the segment voltage may be deliberately switched during each line time to ensure that unactuated pixels spend half their time in each of the two unactuated color states.

Rapid refresh of a display may occur during display of video or similarly dynamic content, such that the next frame is written immediately or soon after the previous frame is finished. However, in other embodiments, a particular frame may be displayed for an extended period of time after the frame is written, by applying hold voltages on each of the common lines for a period of time. In certain embodiments, this may be due to the display of a relatively static image, such as the GUI of a mobile phone or other display. In other embodiments, the number of common lines in the display may be sufficiently small, particularly in embodiments with slow refresh rates or short line times, that the write time for a frame is significantly shorter than the display time for the frame. In other embodiments, the operation of a particular GUI or other display of information may only require a portion of a display may be updated in a given frame, and other portions of the display need not be addressed.

In one embodiment, flicker may be avoided or mitigated by maintaining the segment voltages at a constant voltage during this time period. In particular embodiments, each of the segment voltages are maintained at the same voltage, which may be the high segment voltage, the low segment voltage, or an intermediate voltage. In other embodiments, the voltages may be maintained at the voltage used to write data to the last common line. By maintaining a constant voltage on all segment lines, however, greater uniformity in color across a color display may be provided, as each unactuated pixel of a given color will have a similar applied pixel voltage.

Figure 14:
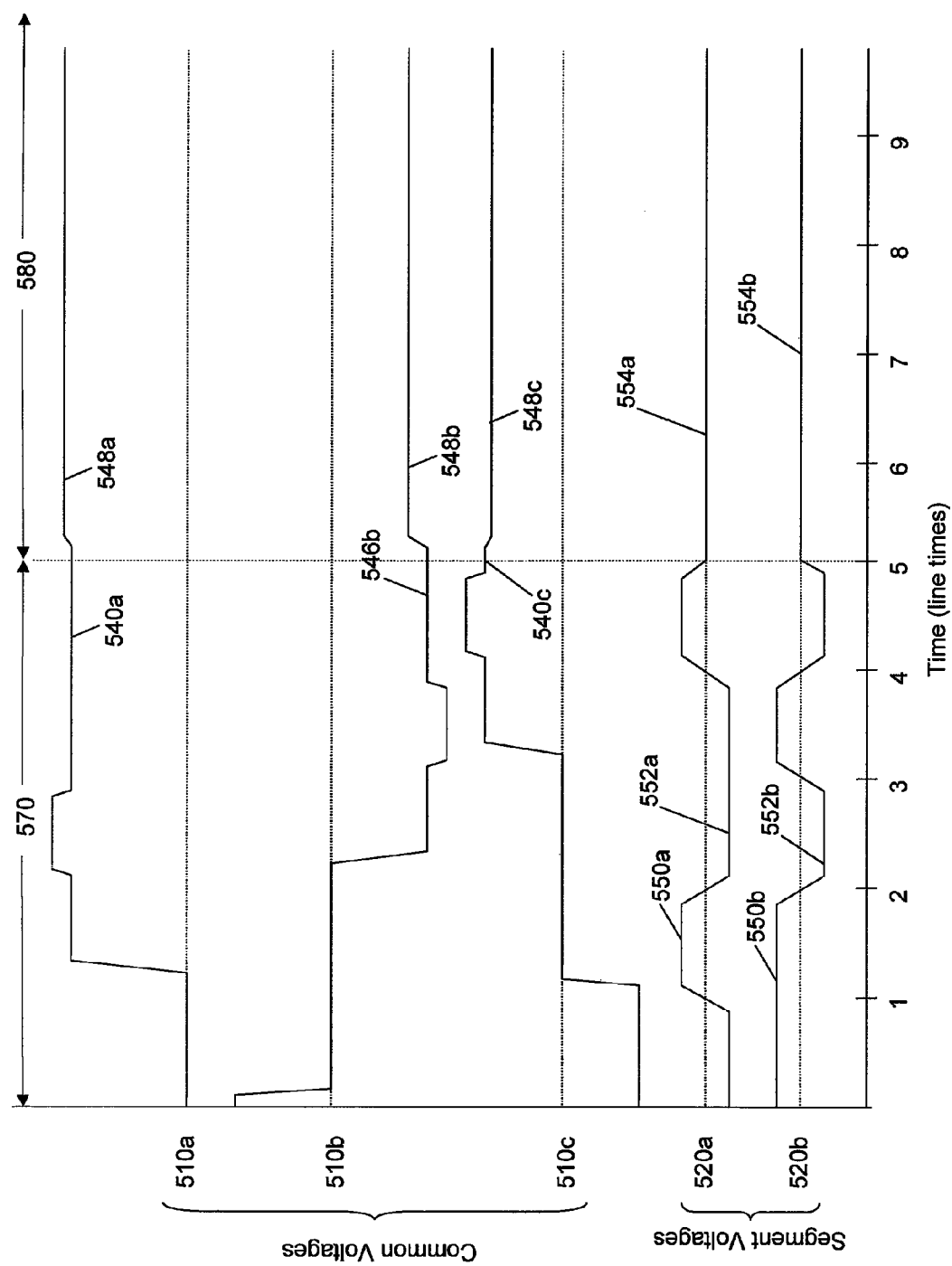
FIG. 14 illustrates another exemplary timing diagram for segment and common signals that may be used in an embodiment with an extended hold time.

FIG. 14 illustrates an embodiment of a display scheme having an extended hold sequence 580 following a frame write 570. The common line voltage applied on a first column line, such as common line 110a of the 2×3 array of FIG. 8, is at a high hold voltage 540a at the end of the frame write 570 (see waveform 510a). Similarly, the common line voltage applied on a second column line such as common line 110b is at a low hold voltage 546b at the end of frame write 570 (see waveform 510b), and the common line voltage applied on a third common line, such as common line 110c, is at a high hold voltage 540c.

The segment voltages applied on segment lines, such as segment lines 120a and 120b of the array of FIG. 8, vary between high segment voltages 550a, 550b and low segment voltages 552a, 552b (see waveforms 520a and 520b, respectively). It can be seen that both of the segment voltage waveforms 520a and 520b are centered around ground, but that other segment voltage values are possible, as discussed above.

At the end of the frame write 570, the voltage applied on segment line 120a (see waveform 520a) moves to an intermediate voltage 554a, and the voltage applied on segment line 120b (see waveform 520b) moves to an intermediate voltage 554b. As noted above, the segment voltages could alternately move to either the high or low segment voltages, or any other voltage, but the use of ground as the segment voltage during the hold state means that the pixel voltage across a given pixel will be substantially equal to the common line voltage applied along the corresponding common line, which may simplify a determination of a desired hold voltage in further embodiments. By applying a uniform voltage on each of the segment lines, the pixel voltage across unactuated pixels on a given common line will be equal. When similar hold voltages are applied on multiple common lines the pixel voltages for all unactuated pixels with a given applied hold voltage will be equal.

Thus, in an RGB display with red, green, and blue common lines, there may be six distinct hold voltages applied during the extended hold sequence 580, high and low red hold voltages, high and low blue hold voltages, and high and low green hold voltages. By applying a uniform segment voltage on each of the segment lines, pixel voltages across unactuated pixels in the array will thus be one of six possible values, two for each color. In contrast, if both high and low segment voltages are applied on the various segment lines, there may be 12 possible pixel voltages, which may lead to significant variation in the color reflected by an interferometric modulator array due to variations in the positions of the unactuated pixels.

In further embodiments, the hold voltages along the common lines may be also be adjusted to account for this effect. In one embodiment, at least one of the low and high hold voltages for a given color may be adjusted to bring the absolute values of the pixel voltages of the pixels at the high and low voltages closer to one another. If the absolute values of the pixel voltages are made substantially equal to one another, all unactuated pixels of a given color will reflect substantially the same color, providing better color uniformity across the display. In addition, the hold voltages for various colors in a multi-color display such as an RGB display may be optimized for the purposes of white balance, such that the color reflected by a combination of the red, green, and blue pixels is at a particular white point to provide a desired white balance.

In other embodiments, both the high and low hold voltages for a given color may be adjusted to provide a desired pixel voltage. For example, a particular shade of red requiring a particular pixel voltage may be desired, and both the high and low voltages may be optimized to provide that desired pixel voltage when the constant segment voltage is applied on the segment lines.

When a fluctuating segment voltage is applied, the hold voltage is limited to voltages which will not cause actuation or release of pixels when either the highest or lowest segment voltage is applied. In contrast, no such margin is required when the applied segment voltage is constant, so the range of possible hold voltages which can be applied along the common lines without changing the state of the pixels is increased. In particular, hold voltages which are closer to the actuation and release voltages of the pixel may be used. In certain embodiments, voltages in this additional range of available voltages may be selected for the hold voltage.

In some embodiments, the optimized hold voltage may be used for the hold voltage even during the frame write periods. However, because the range of voltages which can be used as a hold voltage during the extended hold period 580 is increased, hold voltages which may not be used during the frame write 570 may be used once the frame write 570 is concluded, and constant segment voltages are being applied. This post-write adjustment of the hold voltage is illustrated in FIG. 14, in which the voltage on common line 110a (waveform 510) increases from a high hold voltage 540a to an optimized hold voltage 549a. Similarly, the voltage on common line 110b (waveform 510b) increases from a low hold voltage 446a to an optimized hold voltage 549b, and the voltage on common line 110c (waveform 510c) decreases from a high hold voltage 540c to an optimized hold voltage 549c.

Suitable optimized hold voltages may be determined on a panel by panel basis to account for variations in the manufacturing process. By measuring characteristics of the interferometric modulators, such as the capacitance of the interferometric modulators, appropriate pixel voltages and hold voltages may be determined which provide a desired optical response.

In other embodiments, hold voltages may be optimized even in displays without extended hold periods. Because there may be some room in a given embodiment to adjust the hold voltage while ensuring that the pixel voltage remains within the hysteresis window when the hold voltage is applied along the common line, a hold voltage which minimizes the visual effect of this variation in the position of the movable layer may be selected as the hold voltage. For example, the bias voltage may be selected such that the two hold positions of an unactuated interferometric modulator reflect different shades of the same color, rather than shifting towards another color in one of the states.

Various combinations of the above embodiments and methods discussed above are contemplated. In particular, although the above embodiments are primarily directed to embodiments in which interferometric modulators of particular elements are arranged along common lines, interferometric modulators of particular colors may instead be arranged along segment lines in other embodiments. In particular embodiments, different values for high and low segment voltages may be used for specific colors, and identical hold, release and address voltages may be applied along common lines. In further embodiments, when multiple colors of subpixels are located along common lines and segment lines, such as the four-color display discussed above, different values for high and low segment voltages may be used in conjunction with different values for hold and address voltages along the common lines, so as to provide appropriate pixel voltages for each of the four colors. In addition, the methods of testing described herein may be used in combination with other methods of driving electromechanical devices.

It is also to be recognized that, depending on the embodiment, the acts or events of any methods described herein can be performed in other sequences, may be added, merged, or left out altogether (e.g., not all acts or events are necessary for the practice of the methods), unless the text specifically and clearly states otherwise.

While the above detailed description has shown, described, and pointed out novel features as applied to various embodiments, various omissions, substitutions, and changes in the form and details of the device of process illustrated may be made. Some forms that do not provide all of the features and benefits set forth herein may be made, and some features may be used or practiced separately from others.

What is claimed is:

1. A method of driving an array of electromechanical devices, the array including a plurality of segment lines and a plurality of common lines, the method comprising: performing an actuation operation on an electromechanical device within the array, the electromechanical device being in electrical communication with a first common line and a first segment line, wherein each actuation operation performed on the electromechanical device comprises: applying a release voltage across the electromechanical device, wherein applying a release voltage comprises applying a first voltage on the first common line and a segment voltage on the first segment line, wherein the segment voltage may vary between a maximum voltage and a minimum voltage, and wherein a difference between the maximum voltage and the minimum voltage is less than a width of a hysteresis window of the electromechanical device, and wherein the release voltage remains between a positive release voltage of said electromechanical device and a negative release voltage of said electromechanical device; applying a hold voltage across the electromechanical device after applying the release voltage, wherein applying a hold voltage comprises applying a second voltage on the first common line and the segment voltage on the first segment line and, wherein the hold voltage remains within a hysteresis window of the electromechanical device; and applying an address voltage across the electromechanical device after applying the hold voltage, wherein applying an address voltage comprises applying a third voltage on the first common line and the segment voltage on the first segment line, wherein the address voltage is either greater than a positive actuation voltage of said electromechanical device or less than a negative actuation voltage of said electromechanical device.

2. The method of claim 1, wherein the release voltage varies between a high voltage which is less than a positive release value of the electromechanical device and a low voltage which is greater than a negative release value of the electromechanical device.

3. The method of claim 1, wherein each actuation operation further comprises applying a second hold voltage across the electromechanical device after applying the address voltage, wherein the second hold voltage remains within the hysteresis window of the electromechanical device.

4. The method of claim 1, wherein the hold voltage varies between a high voltage within the hysteresis window of the electromechanical device and a low voltage within the same hysteresis window of the electromechanical device.

5. The method of claim 1, wherein the array of electromechanical devices comprises an array of interferometric modulators.

6. The method of claim 1, additionally comprising performing an actuation operation on a second electromechanical device, wherein the method comprises simultaneously applying a release voltage to said second electromechanical device and applying an address voltage to said first electromechanical device.

7. A display comprising a plurality of electromechanical display elements, the display comprising: an array of electromechanical display elements, the array including a plurality of segment lines and a plurality of common lines; and driver circuitry configured to perform an actuation operation on an electromechanical display element within the array, the electromechanical device being in electrical communication with a first common line and a first segment line, wherein each actuation operation performed on the electromechanical device comprises: applying a release voltage across the electromechanical display element, wherein applying a release voltage comprises applying a first voltage on the first common line and a segment voltage on the first segment line, wherein the segment voltage may vary between a maximum voltage and a minimum voltage, and wherein a difference between the maximum voltage and the minimum voltage is less than a width of a hysteresis window of the electromechanical device, and wherein the release voltage remains between a positive release voltage of said electromechanical display element and a negative release voltage of said electromechanical display element; applying a hold voltage across the electromechanical display element after applying the release voltage, wherein applying a hold voltage comprises applying a second voltage on the first common line and the segment voltage on the first segment line and, wherein the hold voltage remains within a hysteresis window of the electromechanical display element; and applying an address voltage across the electromechanical display element after applying the hold voltage, wherein applying an address voltage comprises applying a third voltage on the first common line and the segment voltage on the first segment line, wherein the address voltage is either greater than a positive actuation voltage of said electromechanical display element or less than a negative actuation voltage of said electromechanical display element.

8. The display of claim 7, wherein the driver circuitry is further configured to apply a second hold voltage across the electromechanical display element after applying the address voltage, wherein the second hold voltage remains within the hysteresis window of the electromechanical display element.

9. The display of claim 7, wherein the hold voltage varies between a high voltage within the hysteresis window of the electromechanical display element and a low voltage within the same hysteresis window of the electromechanical display element.

10. The display of claim 7, wherein the release voltage varies between a high voltage which is less than a positive release value of the electromechanical display element and a low voltage which is greater than a negative release value of the electromechanical display element.

11. The display of claim 7, wherein the driver circuitry is configured to simultaneously apply a release voltage to a second electromechanical display element and an address voltage to said electromechanical display element.

12. The display of claim 7, wherein the array comprises a plurality of interferometric modulators of a first color and a plurality of interferometric modulators of a second color.

13. The display of claim 12, wherein said electromechanical display element comprises an interferometric modulator of the first color, and wherein a second electromechanical display element comprises an interferometric modulator of a second color, wherein the driver circuitry is configured to simultaneously apply a release voltage to the second electromechanical display element and an address voltage to said electromechanical display element.

14. A method of driving an electromechanical device in an array of electromechanical devices, the electromechanical device comprising a first electrode in electrical communication with a segment line spaced apart from a second electrode in electrical communication with a common line, the method comprising:
applying a segment voltage on the segment line, wherein the segment voltage varies between a maximum voltage and a minimum voltage, and wherein a difference between the maximum voltage and the minimum voltage is less than a width of a hysteresis window of the electromechanical device;
applying a reset voltage on the common line, wherein the reset voltage is configured to place the electromechanical device in an unactuated state;
applying a hold voltage on the common line after applying the reset voltage, wherein the hold voltage is different from the reset voltage, and wherein the hold voltage is configured to maintain the electromechanical device in its current state, regardless of the state of the segment voltage; and
applying an overdrive voltage on the common line after applying the hold voltage, wherein the overdrive voltage is configured to cause the electromechanical device to actuate based upon the state of the segment voltage.

15. The method of claim 14, further comprising applying a second hold voltage on the common line after applying the overdrive voltage.

16. The method of claim 15, wherein the first hold voltage is within a first hysteresis window of the electromechanical device and wherein the second hold voltage is within a second hysteresis window of the electromechanical device.

17. The method of claim 16, wherein applying the reset voltage comprises applying a voltage on the common line which varies from the first hold voltage to the second hold voltage, the voltage remaining within a release window of the electromechanical device for a period of time sufficient to cause release of the electromechanical device.

18. The method of claim 14, wherein an absolute value of the overdrive voltage is greater than an absolute value of the hold voltage.

19. The method of claim 14, wherein the hold voltage lies within a hysteresis window of the electromechanical device.

20. A method of driving an array of electromechanical devices, the array including a plurality of common lines and a plurality of segment lines, each electromechanical device comprising a first electrode in electrical communication with a common line spaced apart from a second electrode in electrical communication with a segment line, the method comprising:
applying a segment voltage on each of the plurality of segment lines, wherein the segment voltage applied on a given segment line is switchable between a high segment voltage state and low segment voltage state; and
simultaneously applying a release voltage on a first common line and an address voltage on a second common line, wherein the release voltage causes release of all actuated electromechanical devices along the first common line independent of the state of a segment voltage applied to each electromechanical device, and wherein the address voltage causes actuation of the electromechanical devices dependent upon the state of the segment voltage applied to a given electromechanical device;
applying a first hold voltage on the second common line after applying the address voltage, wherein the first hold voltage maintains the electromechanical devices along the second common line in their respective actuated or released states, and wherein the electromechanical devices along the second common line have a first optical response when the first hold voltage is applied; and
applying a second hold voltage on the second common line after applying the first hold voltage, wherein the second hold voltage maintains the electromechanical devices along the second common line in their respective actuated or released states, wherein the electromechanical devices along the second common line have a second optical response when the second hold voltage is applied, and wherein the first optical response is different from the second optical response.

21. The method of claim 20, wherein the address voltage is applied on the second common line after release of any actuated electromechanical devices located along said second common line.

22. The method of claim 20, wherein the array includes a first plurality of electromechanical devices configured to reflect a first color in an actuated position, and a second plurality of electromechanical devices configured to reflect a second color in an actuated position.

23. The method of claim 22, wherein said first plurality of electromechanical devices are arranged along a first common line, and wherein said second plurality of electromechanical devices are arranged along a second common line.

24. The method of claim 23, wherein the address voltage applied on the first common line is a first address voltage, wherein the address voltage applied on the second common line is a second address voltage, and wherein the first address voltage is different from the second address voltage.

25. The method of claim 22, wherein said first plurality of electromechanical devices are arranged along a first segment line, and wherein said second plurality of electromechanical devices are arranged along a second segment line.

26. The method of claim 25, wherein the segment voltage applied on the first segment line varies between a first high segment voltage and a first low segment voltage, wherein the segment voltage applied on the second segment line varies between a second high segment voltage and a second low segment voltage, and wherein the first high segment voltage is different from the second high segment voltage.

27. A display device, comprising:
an array of electromechanical devices, the array comprising a plurality of common lines and a plurality of segment lines, each electromechanical device comprising a first electrode in electrical communication with a common line spaced apart from a second electrode in electrical communication with a segment line; and
driver circuitry configured to apply high segment voltage and a low segment voltage on segment lines, and configured to apply release voltages and address voltages on common lines, wherein the driver circuitry is configured to:
simultaneously apply a release voltage along a first common line and an address voltage along a second common line, wherein the high and low segment voltages are selected such that the release voltages release electromechanical devices located along a common line regardless of the applied segment voltage, and the address voltages cause actuation of certain electromechanical devices along a common line dependent upon the applied segment voltage;
apply a first hold voltage on the second common line after applying the address voltage, wherein the first hold voltage maintains the electromechanical devices along the second common line in their respective actuated or released states, and wherein the electromechanical devices along the second common line have a first optical response when the first hold voltage is applied; and
apply a second hold voltage on the second common line after applying the first hold voltage, wherein the second hold voltage maintains the electromechanical devices along the second common line in their respective actuated or released states, wherein the electromechanical devices along the second common line have a second optical response when the second hold voltage is applied, and wherein the first optical response is different from the second optical response.

28. The display device of claim 27, wherein the driver circuitry is configured to apply one at least of a release voltage, a high hold voltage, a high address voltage, a low hold voltage, and a low address voltage.

29. The display device of claim 28, wherein a given electromechanical device actuates subsequent to application of the high address voltage on a corresponding common line, and application of the low segment voltage on a corresponding segment line.

30. The display device of claim 28, wherein a given electromechanical device actuates subsequent to application of the low address voltage on a corresponding common line, and application of the high segment voltage on a corresponding segment line.

31. The display device of claim 27, wherein the driver circuitry is further configured to apply the same segment voltages on each of the segment lines when no address voltages are being applied on any common lines.

32. The display device of claim 27, wherein the driver circuitry is further configured to apply the second hold voltage when no address voltages are being applied on any common lines, wherein the second hold voltage is configured to maintain unactuated electromechanical devices in a desired unactuated position.

33. The display device of claim 32, wherein the second hold voltage is selected at least in part based on the resultant the white balance of the array when the second hold voltage is applied.

34. The display device of claim 32, wherein the second hold voltage is different from the first hold voltage.

35. A method of balancing charges within an array of electromechanical devices, the array comprising a plurality of segment lines and a plurality of common lines, the method comprising:
performing a write operation on said common line, wherein performing a write operation comprises:
selecting a polarity for said write operation based at least in part on charge-balancing criteria;
performing a reset operation by applying a reset voltage across a common line, the reset voltage placing each of the electromechanical devices along a common line in an unactuated state;
applying a hold voltage of said selected polarity across said common line, wherein the hold voltage does not cause any of the electromechanical devices along said common line to actuate; and
simultaneously applying an overdrive voltage of said selected polarity across said common line and a plurality of segment voltages across said segment lines, wherein the segment voltages vary between a first polarity and a second polarity, and wherein said overdrive voltage causes the actuation of an electromechanical device when the polarity of the overdrive voltage and the polarity of the corresponding segment voltage are not the same.

36. The method of claim 35, wherein selecting a polarity for said write operation comprises alternating the polarity of write operations on said common line.

37. The method of claim 35, wherein selecting a polarity for said write operation comprises selecting a polarity in a pseudo-random manner.

38. The method of claim 37, wherein selecting a polarity for said write operation in a pseudo-random manner comprises selecting a polarity for a first common line in a pseudo-random pattern, the method further comprising determining a polarity for subsequent write operations in a frame based upon the selected polarity for the first common line.

* * * * *